US010663615B2

(12) United States Patent
Reiderman

(10) Patent No.: US 10,663,615 B2
(45) Date of Patent: May 26, 2020

(54) DOWNHOLE NUCLEAR MAGNETIC RESONANCE TOOL WITH ACTIVE COMPENSATION FOR MOTIONAL EFFECTS

(71) Applicant: Halliburton Energy Services, Inc., Houston, TX (US)

(72) Inventor: Arcady Reiderman, Katy, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

(21) Appl. No.: 15/767,433

(22) PCT Filed: Mar. 9, 2017

(86) PCT No.: PCT/US2017/021635
§ 371 (c)(1),
(2) Date: Apr. 11, 2018

(87) PCT Pub. No.: WO2018/164688
PCT Pub. Date: Sep. 13, 2018

(65) Prior Publication Data
US 2019/0056524 A1 Feb. 21, 2019

(51) Int. Cl.
*G01V 3/32* (2006.01)
*G01R 33/38* (2006.01)
(Continued)

(52) U.S. Cl.
CPC ........... *G01V 3/32* (2013.01); *G01R 33/3808* (2013.01); *G01N 24/081* (2013.01);
(Continued)

(58) Field of Classification Search
CPC .............. G01R 33/3808; G01V 3/32
(Continued)

(56) References Cited

U.S. PATENT DOCUMENTS 6,268,726 B1 * 7/2001 Prammer ................. G01V 3/32
324/303
6,459,263 B2 10/2002 Hawkes et al.
(Continued)

FOREIGN PATENT DOCUMENTS

WO 2015031149 A1 3/2015

OTHER PUBLICATIONS

International Search Report and the Written Opinion for International Application No. PCT/US2017/021635 dated Dec. 7, 2017, 12 pages.
(Continued)

*Primary Examiner* — Dixomara Vargas
(74) *Attorney, Agent, or Firm* — Chamberlain Hrdlicka

(57) ABSTRACT

Nuclear magnetic resonance (NMR) tools, logging systems, and methods for measuring NMR properties of earth formations in a region of interest are provided. The NMR tool includes an antenna assembly, a magnet assembly, a compensating assembly, and a motion sensor. The antenna assembly is operable to generate a radio-frequency magnetic field and the magnet assembly is operable to generate a static magnetic field. The motion sensor is operable to generate readings for lateral motion of the antenna and magnet assemblies. The compensating assembly contains at least one electromagnet and is operable to reduce variation of the static magnetic field in the region of interest due to the lateral motion during NMR measurements based on the readings for the lateral motion.

24 Claims, 13 Drawing Sheets

(51) Int. Cl.
- *G01R 33/34* (2006.01)
- *G01N 24/08* (2006.01)
- *G01R 33/383* (2006.01)
- *G01R 33/44* (2006.01)

(52) U.S. Cl.
CPC ...... *G01R 33/34069* (2013.01); *G01R 33/383* (2013.01); *G01R 33/448* (2013.01)

(58) Field of Classification Search
USPC .................................................. 324/303, 306
See application file for complete search history.

(56) References Cited

U.S. PATENT DOCUMENTS

| | | | |
|---|---|---|---|
| 6,518,756 B1 * | 2/2003 | Morys | ..................... E21B 47/00 324/300 |
| 6,566,874 B1 | 5/2003 | Speier et al. | |
| 6,781,371 B2 | 8/2004 | Taherian et al. | |
| 7,126,333 B2 | 10/2006 | Beard et al. | |
| 7,180,287 B2 | 2/2007 | Rottengatter et al. | |
| 7,268,547 B2 | 9/2007 | Kruspe et al. | |
| 7,339,374 B2 | 3/2008 | Blanz | |
| 7,358,725 B2 | 4/2008 | Blanz | |
| 8,453,730 B2 | 6/2013 | Taherian et al. | |
| 2002/0008514 A1 | 1/2002 | Luong et al. | |
| 2003/0132749 A1 | 7/2003 | Speier et al. | |
| 2003/0210043 A1 | 11/2003 | Freedman | |
| 2004/0124837 A1 | 7/2004 | Prammer et al. | |
| 2005/0088176 A1 | 4/2005 | Kruspe et al. | |
| 2005/0257610 A1 | 11/2005 | Gillen | |
| 2014/0151031 A1 | 6/2014 | Reiderman et al. | |
| 2015/0061664 A1 | 3/2015 | Reiderman et al. | |
| 2016/0202384 A1 | 7/2016 | Utsuzawa et al. | |
| 2017/0254919 A1 * | 9/2017 | Coman | ................... E21B 47/12 |

OTHER PUBLICATIONS

Coman et al. "Improved NMR Logging Approach to Simultaneously Determine Porosity, T2 and T1," SPE-175050-MS, 2015, prepared for presentation at the SPE Annual Technical Conference and Exhibition, Houston, Texas, USA, Sep. 28-30, 2015, pp. 1-27.

* cited by examiner

DOWNHOLE NUCLEAR MAGNETIC RESONANCE TOOL WITH ACTIVE COMPENSATION FOR MOTIONAL EFFECTS

BACKGROUND

This section is intended to provide relevant background information to facilitate a better understanding of the various aspects of the described embodiments. Accordingly, it should be understood that these statements are to be read in this light and not as admissions of prior art.

Downhole nuclear magnetic resonance (NMR) sensors (e.g., "inside out" sensors) have a relatively small radial extent of the sensitivity area making NMR well logging data sensitive to lateral (radial) motion of the tool. In case of NMR logging while drilling (LWD) and/or measuring while drilling (MWD), the lateral motion (vibration) along with rotation may cause severe distortion of the NMR data and even inability to acquire a spin echo signal representing transversal NMR relaxation. While rotational sensitivity may be reduced/eliminated by making an essentially axially symmetrical design of the sensor, the longitudinal and lateral displacement due to tool motion (vibration) remains an unsolved problem for NMR LWD and/or MWD.

BRIEF DESCRIPTION OF THE DRAWINGS

For a detailed description of the embodiments of the invention, reference will now be made to the accompanying drawings in which.

DETAILED DESCRIPTION

In one or more embodiments, a nuclear magnetic resonance (NMR) tool for use in a wellbore and a method for obtaining NMR data in the wellbore are provided. The NMR tool can be an oil well logging apparatus to measure NMR properties of earth formations in a subterranean region of interest. The NMR tool includes an antenna assembly, a magnet assembly, compensating assembly, and one or more motion sensors. The compensating assembly includes an upper electromagnet disposed between an upper end magnet of the magnet assembly and the antenna assembly and a lower electromagnet disposed between a lower end magnet of the magnet assembly and the antenna assembly.

The NMR tool moves along the axis of the wellbore through a subterranean region. Radial or lateral motion of the tool, e.g., due to vibration, is an undesired effect that introduces a measurement error of the NMR data due to the static magnetic field variation in the NMR sensitivity region. The radial or lateral motion is relative to the axis of the NMR tool that is usually aligned or substantially aligned with the axis of the wellbore. The compensating assembly compensates for lateral motion of the tool by reducing the static magnetic field that has an increased field due to lateral motion of the antenna and magnet assemblies and increasing the static magnetic field that has a decreased field due to lateral motion of the antenna and magnet assemblies.

Figure 1A:
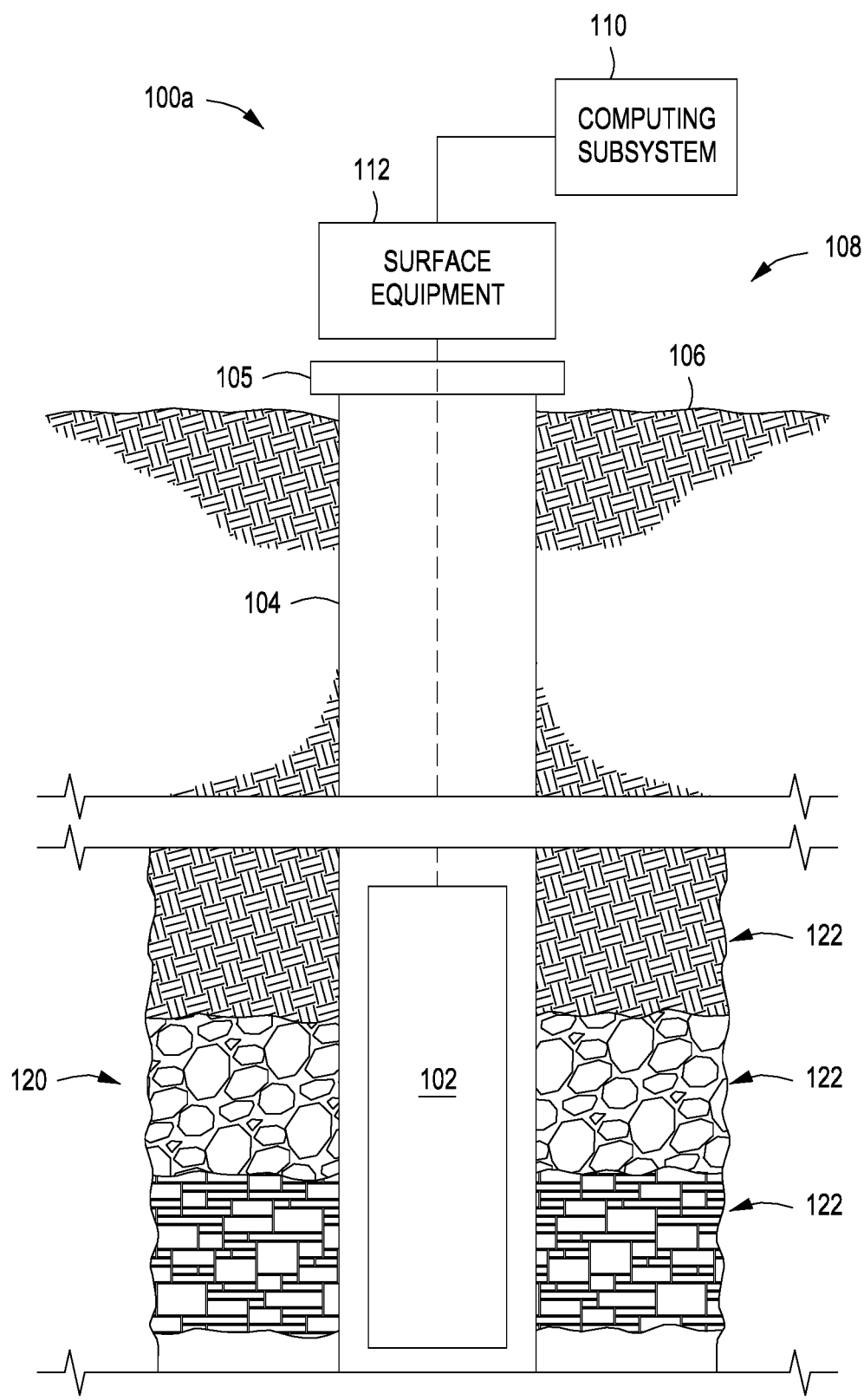
FIGS. 1A-1C depict schematic views of different examples of nuclear magnetic resonance (NMR) logging operations and/or systems in a well system, according to one or more embodiments.

FIG. 1A depicts a schematic view of an NMR logging operation deployed in and around a well system 100a, according to one or more embodiments. The well system 100a includes an NMR logging system 108 and a subterranean region 120 beneath the ground surface 106. The well system 100a can also include additional or different features that are not shown in FIG. 1A. For example, the well system 100a can include additional drilling system components, wireline logging system components, or other components.

The subterranean region 120 includes all or part of one or more subterranean formations, subterranean zones, and/or other earth formations. The subterranean region 120 shown in FIG. 1A, for example, includes multiple subsurface layers 122. The subsurface layers 122 can include sedimentary layers, rock layers, sand layers, or any combination thereof and other types of subsurface layers. One or more of the subsurface layers can contain fluids, such as brine, oil, gas, or combinations thereof. A wellbore 104 penetrates through the subsurface layers 122. Although the wellbore 104 shown in FIG. 1A is a vertical wellbore, the NMR logging system 108 can also be implemented in other wellbore orientations. For example, the NMR logging system 108 may be adapted for horizontal wellbores, slant wellbores, curved wellbores, vertical wellbores, or any combination thereof.

The NMR logging system 108 also includes a logging tool 102, surface equipment 112, and a computing subsystem 110. In the shown in FIG. 1A, the logging tool 102 is a downhole logging tool that operates while disposed in the wellbore 104. The surface equipment 112 shown in FIG. 1A operates at or above the surface 106, for example, near the well head 105, to control the logging tool 102 and possibly other downhole equipment or other components of the well system 100a. The computing subsystem 110 receives and analyzes logging data from the logging tool 102. An NMR logging system can include additional or different features, and the features of an NMR logging system can be arranged and operated as represented in FIG. 1A or in another manner.

All or part of the computing subsystem 110 can be implemented as a component of, or integrated with one or more components of, the surface equipment 112, the logging tool 102, or both. For example, the computing subsystem 110 can be implemented as one or more computing structures separate from but communicative with the surface equipment 112 and the logging tool 102.

The computing subsystem 110 can be embedded in the logging tool 102 (not shown), and the computing subsystem 110 and the logging tool 102 operate concurrently while disposed in the wellbore 104. For example, although the computing subsystem 110 is shown above the surface 106 in FIG. 1A, all or part of the computing subsystem 110 may reside below the surface 106, for example, at or near the location of the logging tool 102.

The well system 100*a* includes communication or telemetry equipment that allows communication among the computing subsystem 110, the logging tool 102, and other components of the NMR logging system 108. For example, each of the components of the NMR logging system 108 can include one or more transceivers or similar apparatus for wired or wireless data communication among the various components. The NMR logging system 108 can include, but is not limited to, one or more systems and/or apparatus for wireline telemetry, wired pipe telemetry, mud pulse telemetry, acoustic telemetry, electromagnetic telemetry, or any combination of these and other types of telemetry. In some embodiments, the logging tool 102 receives commands, status signals, or other types of information from the computing subsystem 110 or another source. The computing subsystem 110 can also receive logging data, status signals, or other types of information from the logging tool 102 or another source.

NMR logging operations are performed in connection with various types of downhole operations at various stages in the lifetime of a well system and therefore structural attributes and components of the surface equipment 112 and logging tool 102 are adapted for various types of NMR logging operations. For example, NMR logging may be performed during drilling operations, during wireline logging operations, or in other contexts. As such, the surface equipment 112 and the logging tool 102 can include or operate in connection with drilling equipment, wireline logging equipment, or other equipment for other types of operations.

Figure 1B:
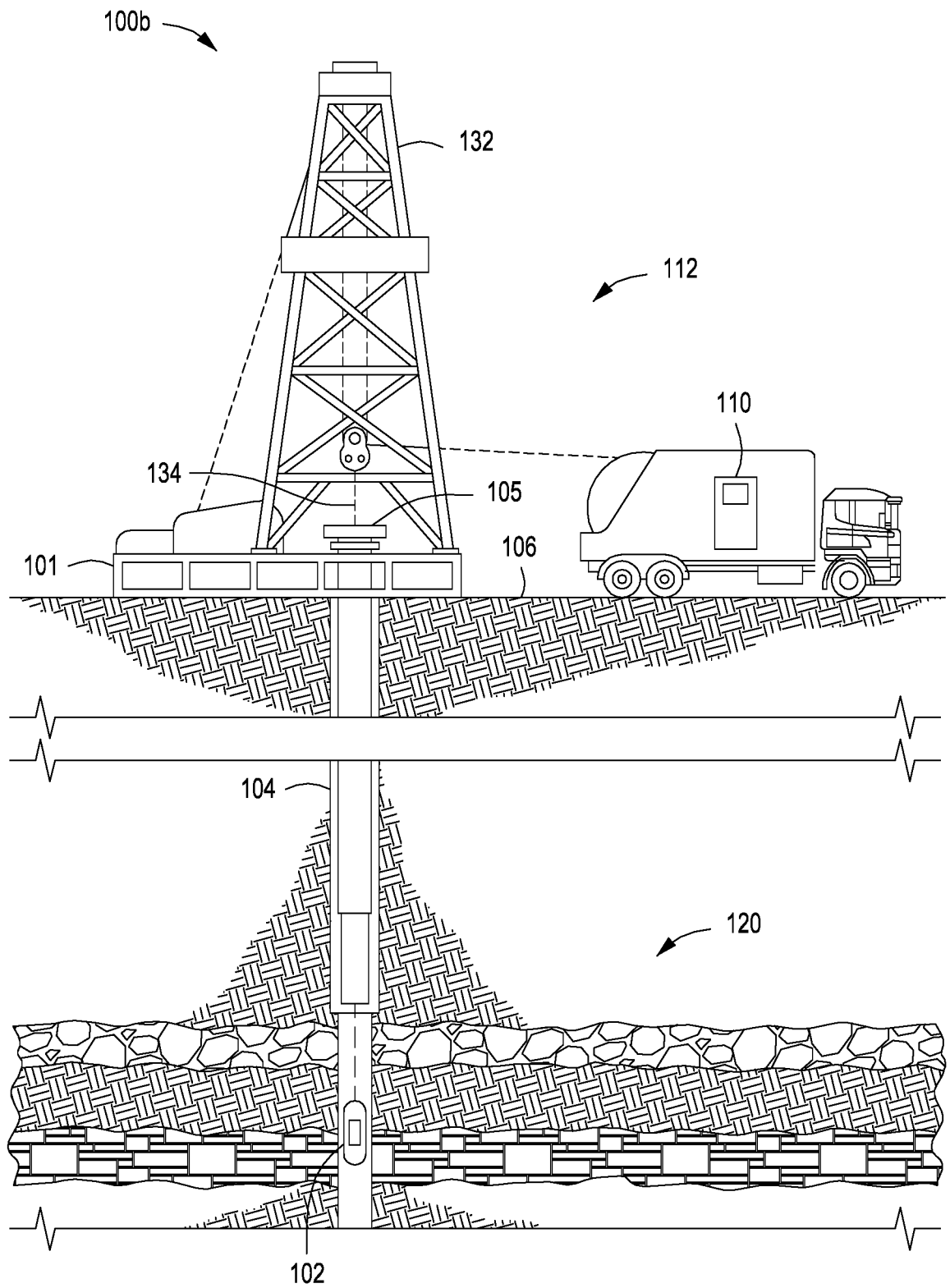

FIG. 1B depicts a schematic view of a wireline NMR logging operation deployed in and around a well system 100*b*, according to one or more embodiments. The well system 100*b* includes the NMR logging tool 102 in a wireline logging environment within the subterranean region 120 in an earth formation. The surface equipment 112 includes, but is not limited to, a platform 101 disposed above the surface 106 equipped with a derrick 132 that supports a wireline cable 134 extending into the wellbore 104. Wireline logging operations are performed, for example, after a drill string is removed from the wellbore 104, to allow the wireline logging tool 102 to be lowered by wireline or logging cable into the wellbore 104.

Figure 1C:
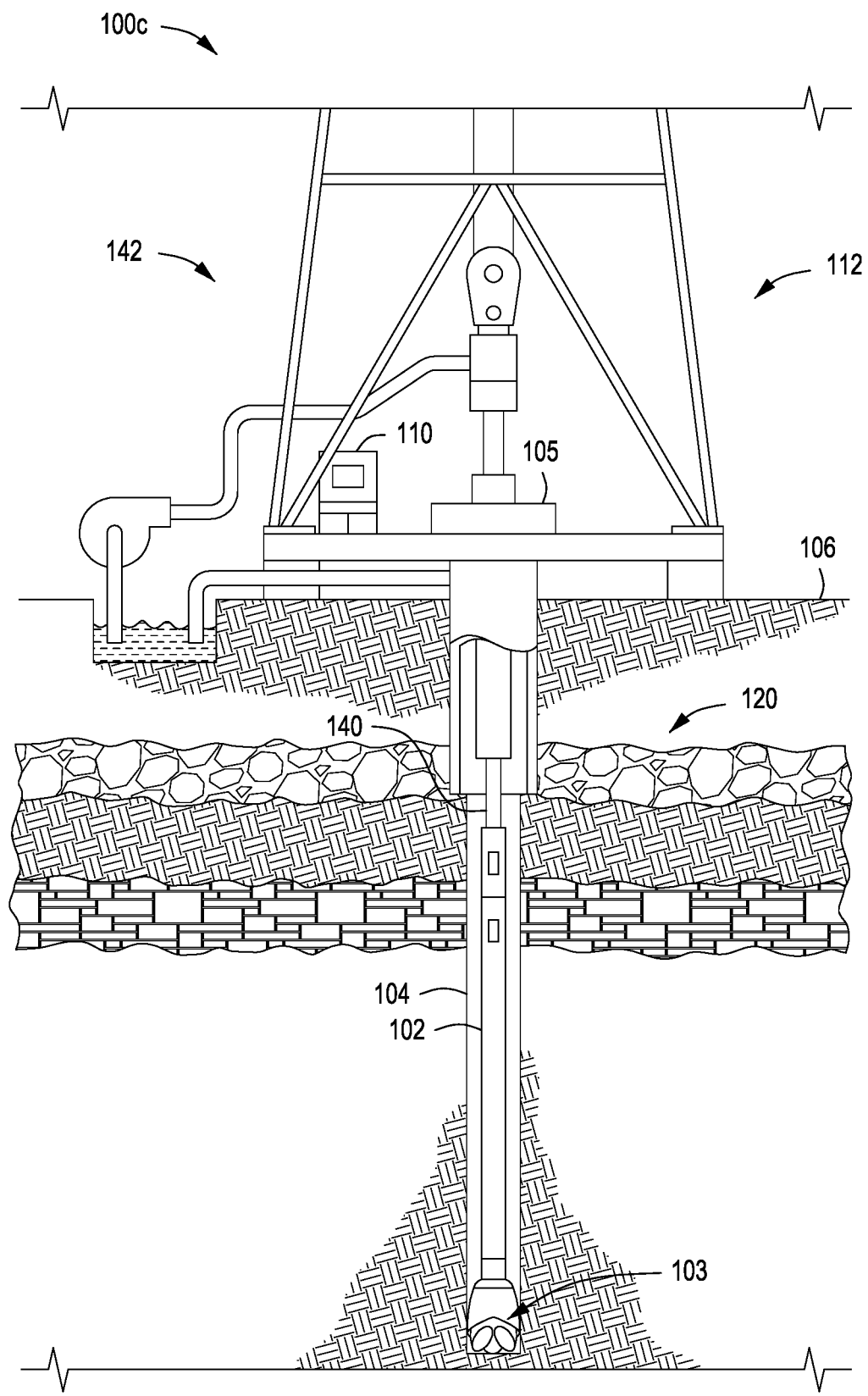

FIG. 1C depicts a schematic view of a well system 100*c* that includes the NMR logging tool 102 in a logging while drilling (LWD) environment within the subterranean region 120 in an earth formation, according to one or more embodiments. NMR logging operations is performed during drilling operations. Drilling is performed using a string of drill pipes connected together to form a drill string 140 that is lowered through a rotary table into the wellbore 104. The drill string 140 includes one or more drill bits 103. A drilling rig 142 at the surface 106 supports the drill string 140, as the drill string 140 is operated to drill a wellbore penetrating the subterranean region 120. The drill string 140 can include, for example, but is not limited to, a kelly, a drill pipe, a bottom hole assembly, and other components. The bottomhole assembly on the drill string 140 can include, but is not limited to, one or more of drill collars, drill bits 103, the logging tool 102, and other components. Exemplary logging tools can be or include, but are not limited to, measuring while drilling (MWD) tools and LWD tools.

The logging tool 102 includes an NMR tool for obtaining NMR measurements from the subterranean region 120. As shown, for example, in FIG. 1B, the logging tool 102 is suspended in the wellbore 104 by one or more conveyances, devices, or structures that connects the tool to a surface control unit or other components of the surface equipment 112. The conveyance, device, or structure can be or include, but is not limited to, one or more coiled tubings, slicklines, wireline cables, drill strings, drill pipes, tubulars, tractors, or any combination thereof.

The logging tool 102 is lowered to the bottom of a region of interest and subsequently pulled upward (e.g., at a substantially constant speed) through the region of interest. As shown, for example, in FIG. 1C, the logging tool 102 is deployed in the wellbore 104 on jointed drill pipe, hard wired drill pipe, or other deployment hardware. In other example implementations, the logging tool 102 collects data during drilling operations as it moves downward through the region of interest. The logging tool 102 may also collect data while the drill string 140 is moving, for example, while the logging tool 102 is being tripped in or tripped out of the wellbore 104.

The logging tool 102 may also collect data at discrete logging points in the wellbore 104. For example, the logging tool 102 moves upward or downward incrementally to each logging point at a series of depths in the wellbore 104. At each logging point, instruments in the logging tool 102 perform measurements on the subterranean region 120. The logging tool 102 also obtains measurements while the logging tool 102 is moving (e.g., being raised or lowered). The measurement data is communicated to the computing subsystem 110 for storage, processing, and analysis. Such data may be gathered and analyzed during drilling operations (e.g., LWD operations), during wireline logging operations, other conveyance operations, or during other types of activities.

The computing subsystem 110 receives and analyzes the measurement data from the logging tool 102 to detect properties of various subsurface layers 122. For example, the computing subsystem 110 can identify the density, material content, and/or other properties of the subsurface layers 122 based on the NMR measurements acquired by the logging tool 102 in the wellbore 104.

The logging tool 102 obtains NMR signals by polarizing nuclear spins in the formation 120 and pulsing the nuclei with a radio frequency (RF) magnetic field. Various pulse sequences (i.e., series of radio frequency pulses, delays, and other operations) are used to obtain NMR signals, including the Carr Purcell Meiboom Gill (CPMG) sequence (in which the spins are first tipped using a tipping pulse followed by a series of refocusing pulses), the Optimized Refocusing Pulse Sequence (ORPS) in which the refocusing pulses are less than 180°, a saturation recovery pulse sequence, and other pulse sequences.

Figure 2A:
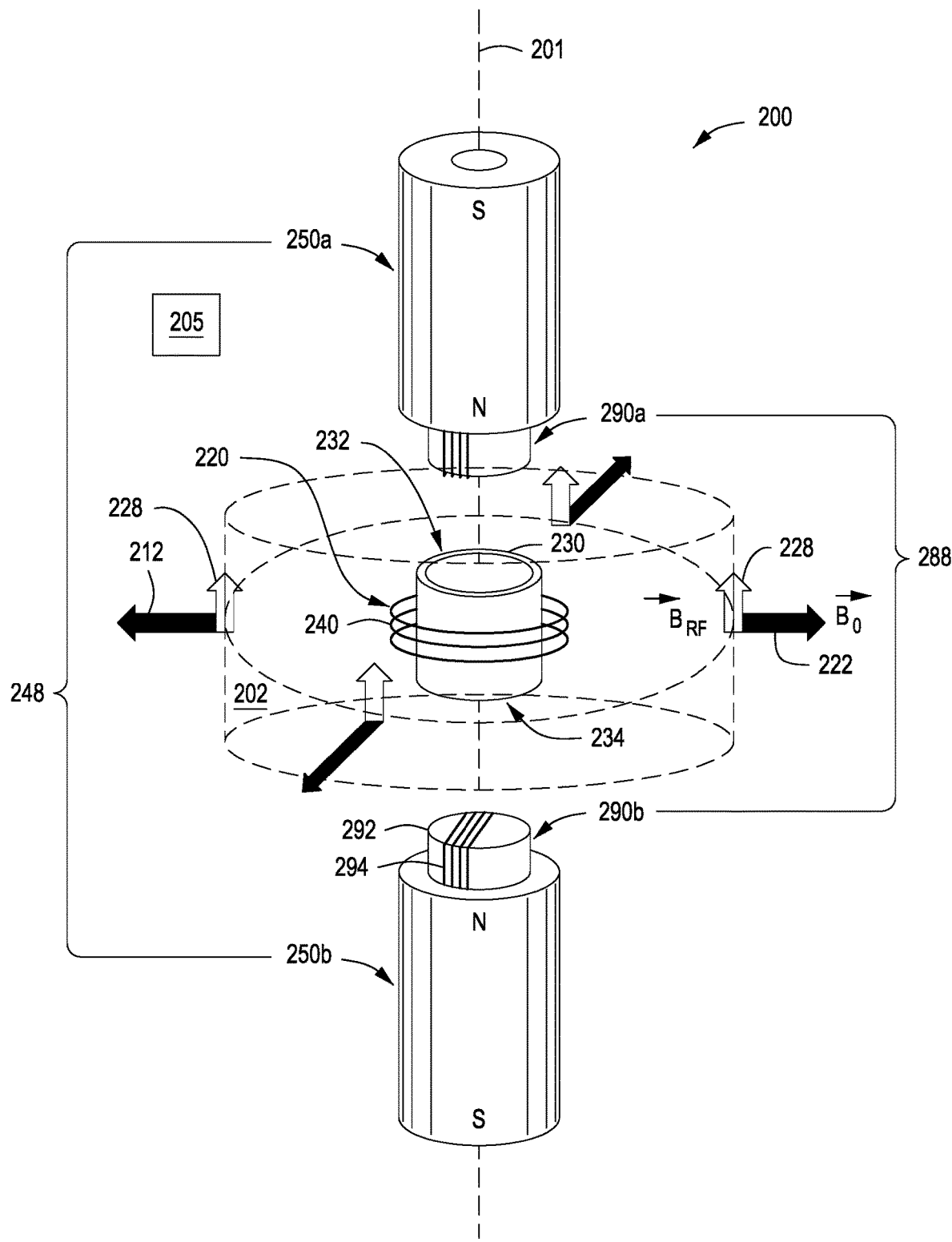
FIGS. 2A-2C depict schematic views of an NMR tool, according to one or more embodiments.
Figure 2B:
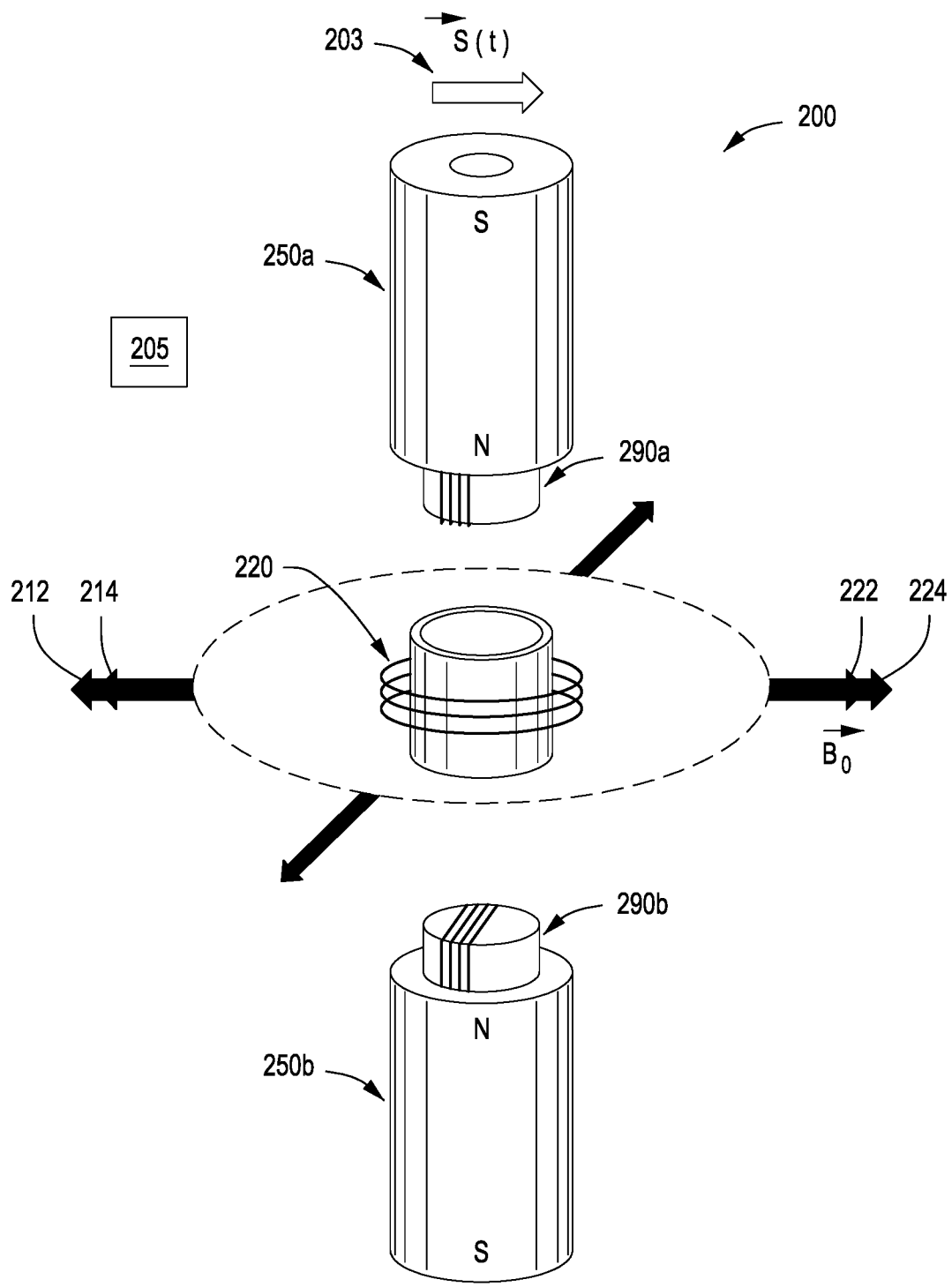
Figure 2C:
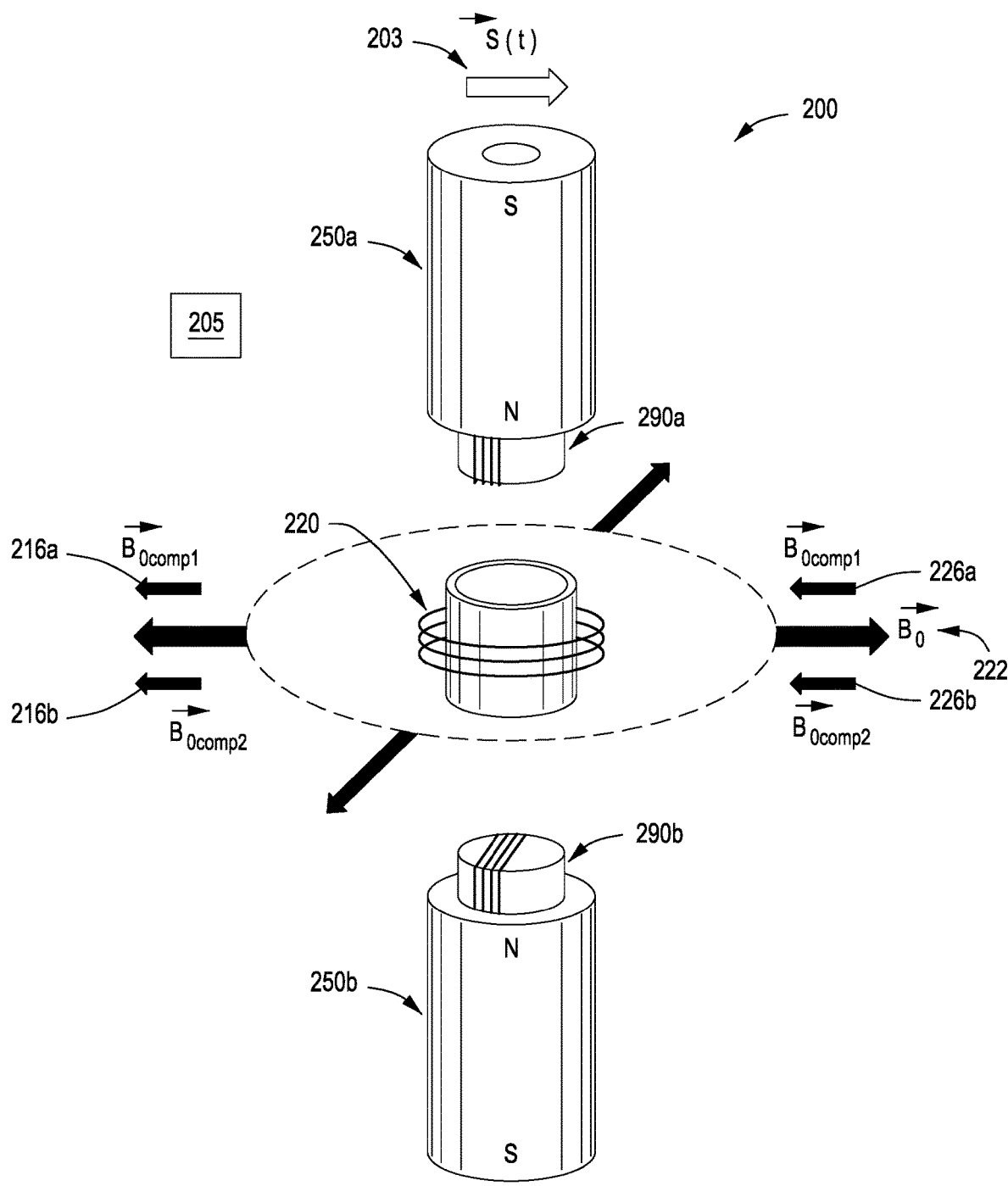

FIGS. 2A-2C depict schematic views of an NMR tool 200 at different intervals of use, according to one or more embodiments. The NMR tool 200 includes, but is not limited to, one or more antenna assemblies 220, one or more magnet assemblies 248, and one or more compensating assemblies 288. In one or more embodiments, the NMR tool 200 can be or include the NMR logging tool 102, depicted in FIGS. 1A-1C, and can be used in the wellbore 104 with any or all components of the well systems 100*a*, 100*b*, and/or 100*c*, as discussed and described above. For example, a logging system located in or around any of the well systems 100*a*, 100*b*, or 100*c*, or another logging system, can include the NMR tool 200 operatively coupled to a drill string or wireline (not shown) and/or other components and used in the wellbore 104. FIG. 2A depicts the NMR tool 200 having no lateral movement, the antenna assembly 220 and the magnet assembly 248 activated and generating magnetic fields, and the compensating assembly 288 inactivated and not generating a magnetic field.

The antenna assembly 220 includes one or more antenna windings 240 at least partially or completely wound, disposed, or positioned circumferentially around a soft magnetic core 230 (e.g., three antenna windings 240 are depicted in FIGS. 2A-2C). The soft magnetic core 230 can contain one, two, or more permanent magnets positioned therein (not shown). The soft magnetic core 230 includes an upper axial end 232 opposite a lower axial end 234. The upper and lower axial ends 232, 234 are axially aligned about a common axis 201 of the NMR tool 200.

The magnet assembly 248 includes at least two end magnets, such as an upper end magnet 250a and a lower end magnet 250b. The upper end magnet 250a is spaced apart from the upper axial end 232 of the soft magnetic core 230 and is axially aligned about the common axis 201. The lower end magnet 250b is spaced apart from the lower axial end 234 of the soft magnetic core 230 and is axially aligned about the common axis 201. The north poles of the end magnets 250a, 250b are facing toward the antenna assembly 220, as depicted in FIGS. 2A-2C. The antenna assembly 220 and the magnet assembly 248 produce or generate a static magnetic field (represented by arrows 212, 222) and a radio-frequency magnetic field (represented by arrows 228) within a volume 202 (e.g., volume of investigation) in a subterranean region.

The compensating assembly 288 includes an upper compensating electromagnet 290a and a lower compensating electromagnet 290b. The upper electromagnet 290a is located between the upper end magnet 250a and the upper axial end 232 of the soft magnetic core 230 and axially aligned about the common axis 201. The lower electromagnet 290b is located between the lower end magnet 250b and the lower axial end 234 of the soft magnetic core 230 and axially aligned about the common axis 201.

Figure 2D:
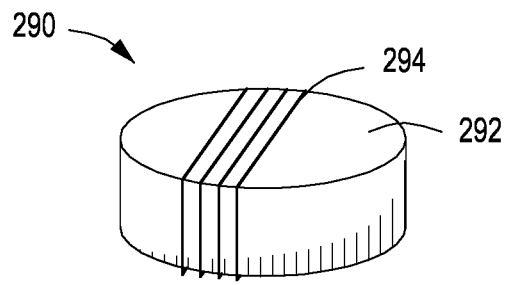
FIG. 2D depicts a schematic view of a compensating electromagnet that can be used in an NMR tool, according to one or more embodiments.
Figure 3:
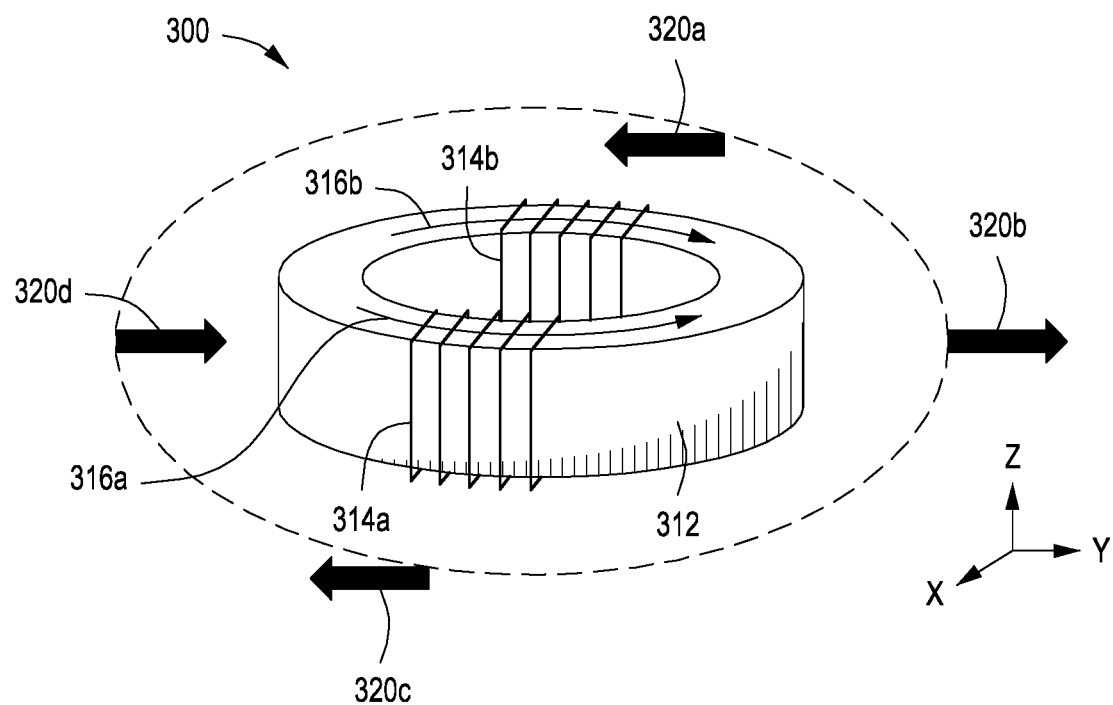
FIG. 3 depicts a schematic view of another compensating electromagnet that can be used in an NMR tool, according to one or more embodiments.

Each of the upper electromagnet 290a and the lower electromagnet 290b includes one or more magnetic cores 292 and one, two, or more windings 294. The magnetic core 292 can be or contain a soft magnetic core. The windings 294 are at least partially or completely wound, disposed, or positioned around the magnetic core 292. For example, the windings 294 are wound around the upper, lower, and side surfaces of the magnetic core 292. Each of the windings 294 can be or include a single winding (as depicted in FIGS. 2A-2D), a two-section winding (as depicted in FIG. 3), two orthogonal, two-section windings (FIGS. 4A-4C and 5), or have other winding configurations, some of which will be further discussed below. For example, a compensating electromagnet 290 (also referred to as a compensating time varying dipole) includes a plurality of windings 294 at least partially or completely wound around the magnetic core 292, as depicted in FIG. 2D, can be used in the NMR tool 200, as well as other NMR tools discussed and described herein.

In another embodiment, depicted in FIG. 3, a compensating electromagnet 300 includes a plurality of windings 294 at least partially or completely wound the magnetic core 292, as depicted in FIG. 2D, can be used in the NMR tool 200, as well as other NMR tools discussed and described herein.

The upper end magnet 250a is positioned to have a north pole of the upper end magnet 250a facing toward the upper electromagnet 290a and the upper axial end 232 of the soft magnetic core 230. The lower end magnet 250b is positioned to have a north pole of the lower end magnet 250b facing toward the lower electromagnet 290b and the lower axial end 234 of the soft magnetic core 230. The upper end magnet 250a is positioned to have a south pole of the upper end magnet 250a facing away from the upper electromagnet 290a and the upper axial end 232 of the soft magnetic core 230. The lower end magnet 250b is positioned to have a south pole of the lower end magnet 250b facing away from the lower electromagnet 290b and the lower axial end 234 of the soft magnetic core 230.

FIG. 2B depicts the NMR tool 200 having lateral movement with the antenna assembly 220 and the magnet assembly 248 activated and generating magnetic fields and the compensating assembly 288 inactivated and not generating a magnetic field. The NMR tool 200 is depicted as laterally moved from left to right in FIG. 2B, as indicated by the lateral displacement vector $\vec{s}(t)$ at 203.

One type of NMR experiment that can be implemented downhole to acquire NMR relaxation parameters is a CPMG experiment containing exciting nuclei with a sequence of radio-frequency pulses starting with an excitation pulse followed by a plurality of refocusing pulses. An NMR signal is generated in response to the radio-frequency pulse sequence in a form of plurality of spin echoes occurring between the refocusing pulses. Due to lateral motion during the CPMG experiment the static magnetic field seen by excited nuclei on the right side (FIG. 2B) of the sensitive region increases from the static magnetic field shown at 222 to the static magnetic field shown at 224. The magnetic field at the opposite side of the sensitivity region decreases from the static magnetic field shown at 212 to the static magnetic field shown at 214. The compensating assembly 288 reduces variation of the static magnetic field in the region of interest due to the lateral motion during NMR measurements based on the readings for the lateral motion.

The NMR tool 200 includes a compensating system 205 that contains, but is not limited to, one or more motion sensors, one or more sensor data processing units, a digital-to-analog converter (DAC), a power amplifier, a calibration system containing one or more magnetic field sensors, or any combination thereof. The one or more motion sensors (not shown) are disposed on and/or within the NMR tool 200. The motion sensor can be or include, but is not limited to, one or more accelerometers, one or more gyroscopes, one or more magnetometers, or any combination thereof. The motion sensor generates or otherwise produces readings for lateral motion of the antenna assembly 220, the magnet assembly 248, and/or the NMR tool 200.

The sensor data processing unit and the calibration system containing the one or more magnetic field sensors are used to calibrate the compensating assembly in order to determine the coefficients $\alpha_1$ and $\alpha_2$. The sensor data processing unit (not shown) and the calibration system (not shown), and portions thereof, can be disposed downhole and/or on the surface outside of the wellbore. For example, the sensor data processing unit and the calibration system can be disposed on and/or within the NMR tool 200 and/or adjacent the NMR tool 200 when downhole. In other examples, one or more portions or components of the sensor data processing unit and/or the calibration system can be downhole with the NMR tool 200 and in operative communication with one or more portions or components of the sensor data processing unit and/or the calibration system disposed outside of the wellbore, such as on the surface or ground level. The sensor data processing unit generates a time varying value proportional to the lateral motion of the antenna assembly 220, the magnet assembly 248, and/or the NMR tool 200. For example, the motion sensor and the sensor data processing unit are used to determine at least the lateral displacement vector $\vec{s}(t)$ 203 of the NMR tool 200 including the antenna assembly 220 and the magnet assembly 248.

FIG. 2C depicts the NMR tool 200 having or experiencing lateral movement with the antenna assembly 220 and the magnet assembly 248 activated and generating magnetic fields and the compensating assembly 288 also activated and generating magnetic fields. The compensating assembly 288 provides a lateral motion effect compensation using the upper and lower electromagnets 290a, 290b. For example, the upper and lower electromagnets 290a, 290b produce magnetic fields to compensate for the lateral motion of the NMR tool 200. The compensating assembly 288 is activated and reduces the static magnetic field 222 that has an increased field due to lateral motion of the antenna and magnet assemblies 220, 248, such as when the NMR tool 200 is moved. Also, the compensating assembly 288 is activated and increases the static magnetic field 222 that has a decreased field due to lateral motion of the antenna and magnet assemblies 220, 248. The effective dipole moment, $\vec{p}_m(t)$, of the upper and lower electromagnets 290a, 290b is proportional to the lateral displacement, $\vec{s}(t)$, by the formula: $\vec{p}_m(t) \propto \vec{s}(t)$. For example, the upper and lower electromagnets 290a, 290b can be activated to produce magnetic fields 226a, 226b that reduce the total static magnetic field that was increased due to the lateral motion of the antenna and magnet assemblies 220, 248 and increase the static magnetic field (additional magnetic field 216a, 216b) that was reduced due to the lateral motion of the antenna and magnet assemblies 220, 248. As a result, the magnetic field seen by the nuclei spins remains unchanged or substantially unchanged, as if the NMR tool 200 did not experience lateral motion.

The current driving the upper and lower electromagnets 290a, 290b are proportional to the motion sensor readings: $i(t) = \alpha \times \vec{s}(t)$, where the coefficient $\alpha$ can be determined during calibration of the magnetic field of the compensating assembly 288.

In one or more embodiments, the antenna assembly 220 generates a radio-frequency magnetic field and the magnet assembly 248 generates a static magnetic field. In one or more embodiments, the motion sensor in the compensating system 205 generates readings for the lateral motion of the antenna and magnet assemblies 220, 248 and the compensating assembly 288 includes at least one, two, or more electromagnets 290 driven by a source of electric current. In some examples, the at least one electromagnet 290 can be or include the upper and lower electromagnets 290a, 290b. The electric current can be generated relative or proportional to the readings from the motion sensor for the lateral motion. The compensating assembly 288 reduces or eliminates the static magnetic field variations in the region of interest due to lateral motion of the magnet assembly 248.

FIG. 3 depicts a schematic view of a compensating electromagnet 300 that is used in an NMR tool 200 or other NMR tools, according to one or more embodiments. The compensating electromagnet 300 includes a plurality of windings 314a, 314b (a two-section winding) at least partially wound, disposed, or positioned around a magnetic core 312, such as a soft magnetic core. The sections of the windings 314a, 314b connect to generate magnetic flux substantially in the same direction (shown by arrows 316a, 316b)—which makes the compensating electromagnet 300 an essentially Y-dipole, as depicted by the shown coordinate system. The magnetic field of the compensating electromagnet at the volume of investigation (surrounding the magnet/antenna assembly) is shown at arrows 320a, 320b, 320c, and 320d.

The range of magnetic field strength ΔB that is desired to be produced by the upper electromagnet 290a and the lower electromagnet 290b of the compensating assembly 288 can be determined by the static magnetic field gradient G at the volume 202 (e.g., volume of investigation) and the maximum expected lateral displacement Δs via the equation ΔB=G×Δs. For example, if G is about 0.05 T/m and Δs is about $5 \times 10^{-3}$ m, then the ΔB is up to about $2.5 \times 10^{-4}$ T. In one or more embodiments, the upper electromagnet 290a and the lower electromagnet 290b of the compensating assembly 288 generate the magnetic field strength from a power in a range from about 5 W to about 15 W, which is much less than the typical amount of power for generating a CPMG radio-frequency pulse sequence.

Figure 4A:
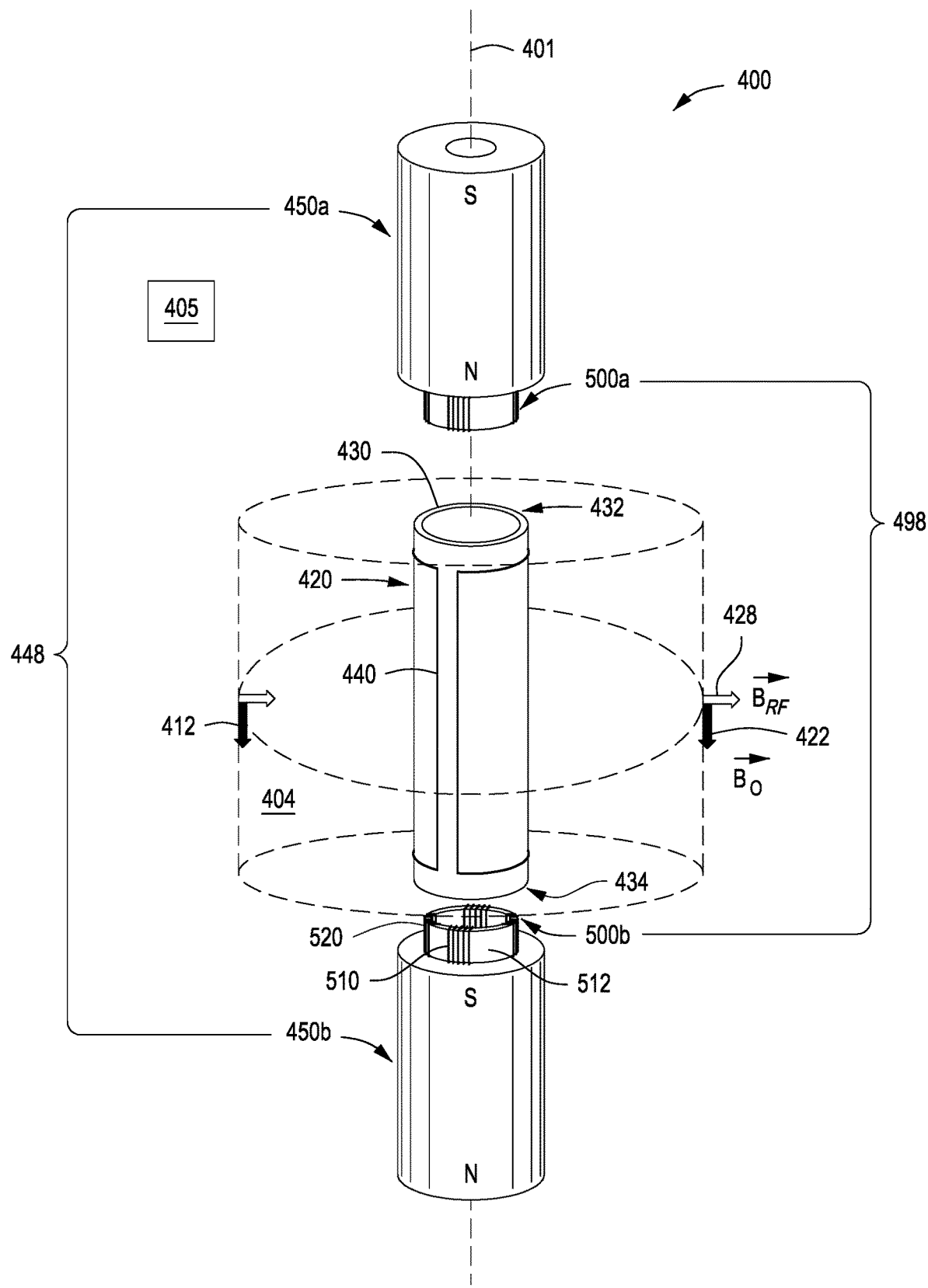
FIGS. 4A-4C depict a schematic view of another NMR tool, according to one or more embodiments.
Figure 4B:
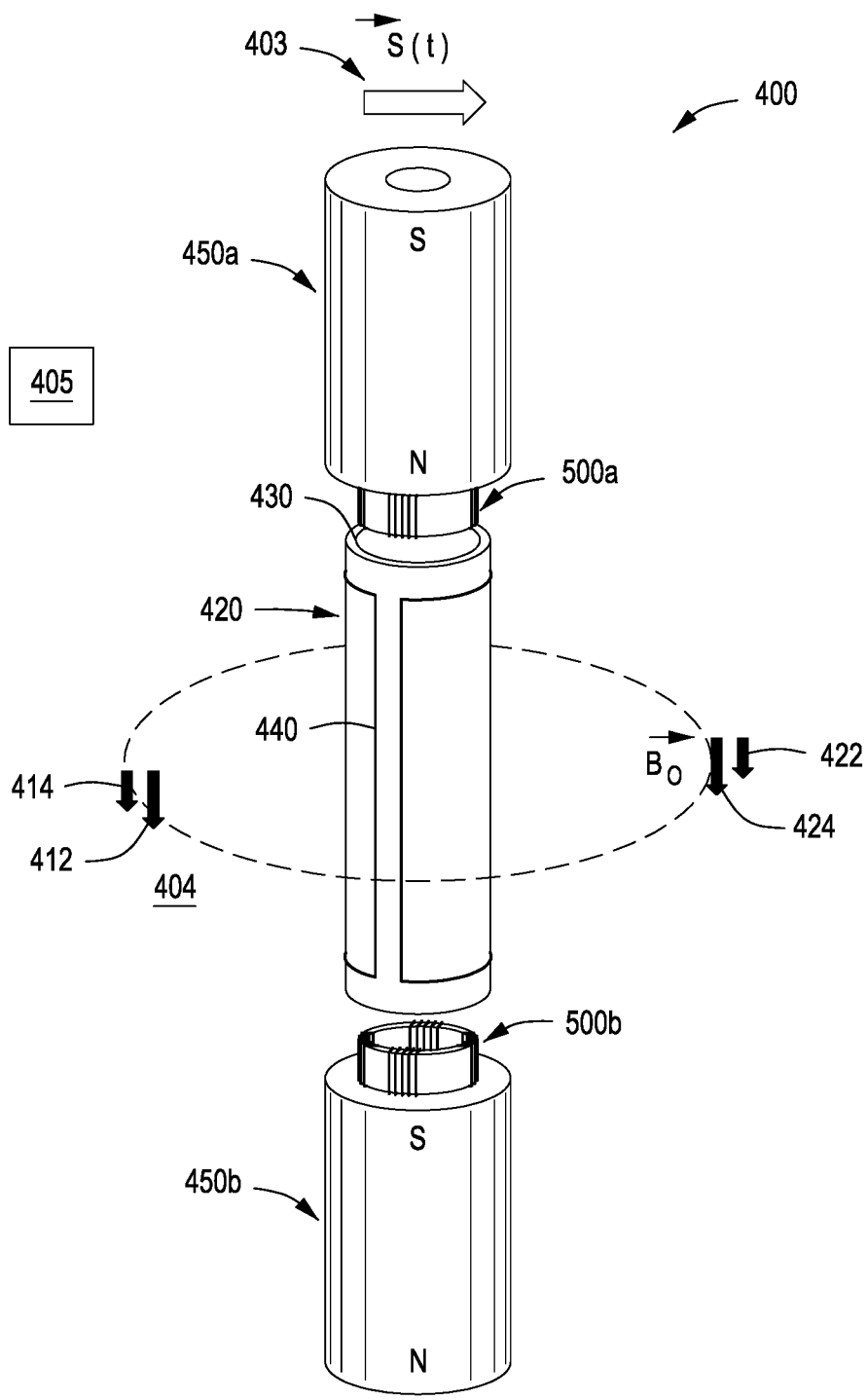
Figure 4C:
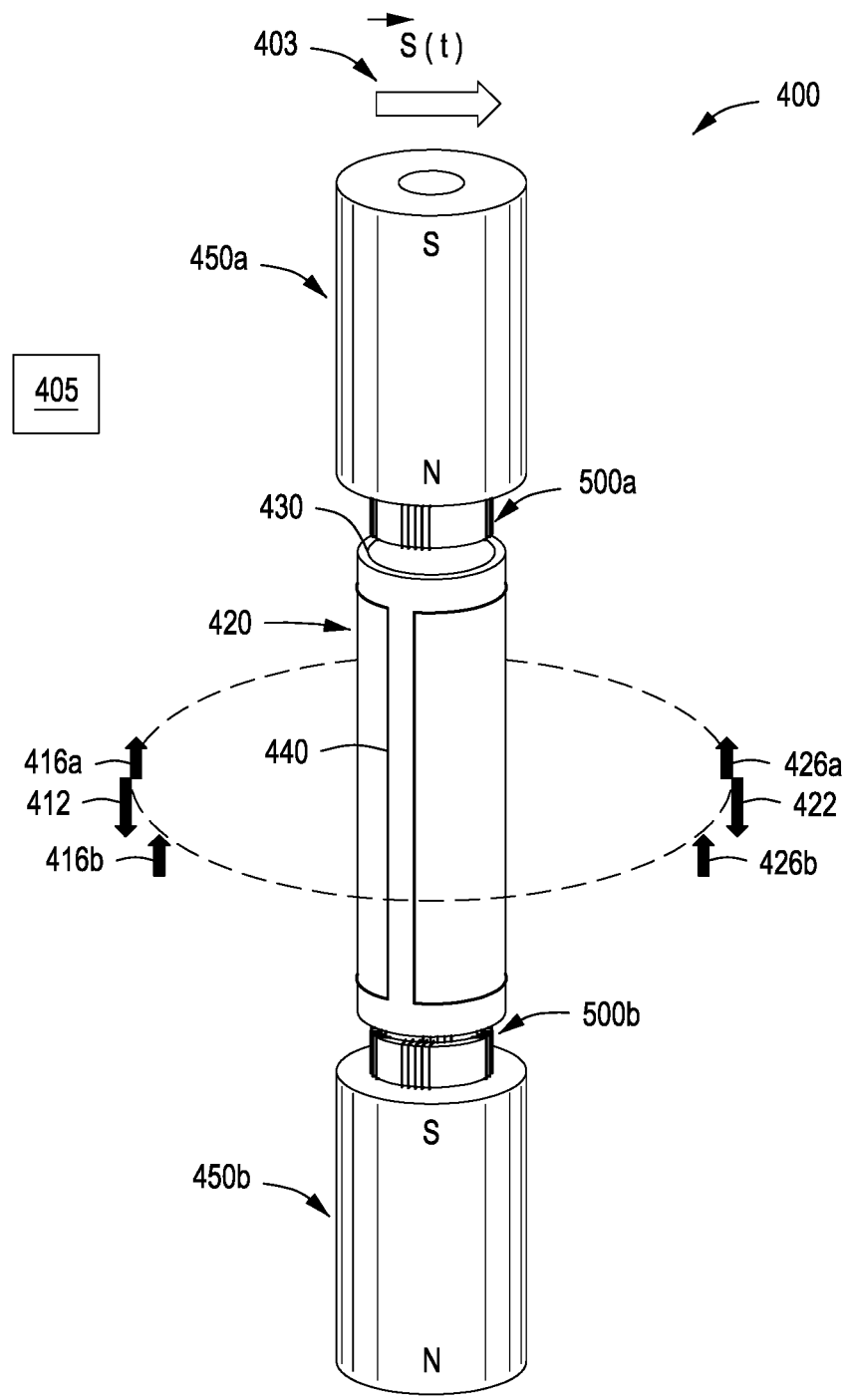

FIGS. 4A-4C depict schematic views of an NMR tool 400 at different intervals of use, according to one or more embodiments. The NMR tool 400 can be or include a LWD NMR sensor assembly. The NMR tool 400 includes, but is not limited to, one or more antenna assemblies 420, one or more magnet assemblies 448, and one or more compensating assemblies 498. In one or more embodiments, the NMR tool 400 is or includes the NMR logging tool 102, depicted in FIGS. 1A-1C, and can be used in the wellbore 104 with any or all components of the well systems 100a, 100b, and/or 100c, as discussed and described above. For example, a logging system located in or around any of the well systems 100a, 100b, or 100c, or another logging system, can include the NMR tool 400 operatively coupled to a drill string or wireline (not shown) and/or other components and used in the wellbore 104. FIG. 4A depicts the NMR tool 400 having no lateral movement, the antenna assembly 420 and the magnet assembly 448 activated and generating magnetic fields, and the compensating assembly 498 inactivated and not generating a magnetic field.

The antenna assembly 420 includes one or more antenna windings 440 at least partially wound, disposed, or positioned circumferentially around a soft magnetic core 430. The soft magnetic core 430 can contain one, two, or more permanent magnets positioned therein (not shown). The soft magnetic core 430 includes an upper axial end 432 opposite a lower axial end 434. The upper and lower axial ends 432, 434 are axially aligned about a common axis 401 of the NMR tool 400.

The magnet assembly 448 includes at least two end magnets, such as an upper end magnet 450a and a lower end magnet 450b. The upper end magnet 450a is spaced apart from the upper axial end 432 of the soft magnetic core 430 and is axially aligned about the common axis 401. The lower end magnet 450b is spaced apart from the lower axial end 434 of the soft magnetic core 430 and is axially aligned about the common axis 401. The north pole of the end magnet 450a faces toward the south pole of the end magnet 450b and the antenna assembly 420 is disposed therebetween on the soft magnetic core 430, as depicted in FIGS. 4A-4C. Alternatively, not shown, the south pole of the end magnet 450a can face toward the north pole of the end magnet 450b and the antenna assembly 420 can be disposed therebetween. The antenna assembly 420 and the magnet assembly 448 produces or generates a static magnetic field (represented by arrows 412, 422) and a radio-frequency magnetic field (represented by arrows 428) within a volume 404 (e.g., volume of investigation) in a subterranean region.

The compensating assembly 498 includes an upper electromagnet 500a and a lower electromagnet 500b. The upper electromagnet 500a is located between the upper end magnet 450a and the upper axial end 432 of the soft magnetic core 430. The upper electromagnet 500a is axially aligned about the common axis 401. The lower electromagnet 500b is located between the lower end magnet 450b and the lower axial end 434 of the soft magnetic core 430. The lower electromagnet 500b is axially aligned about the common axis 401.

Figure 5:
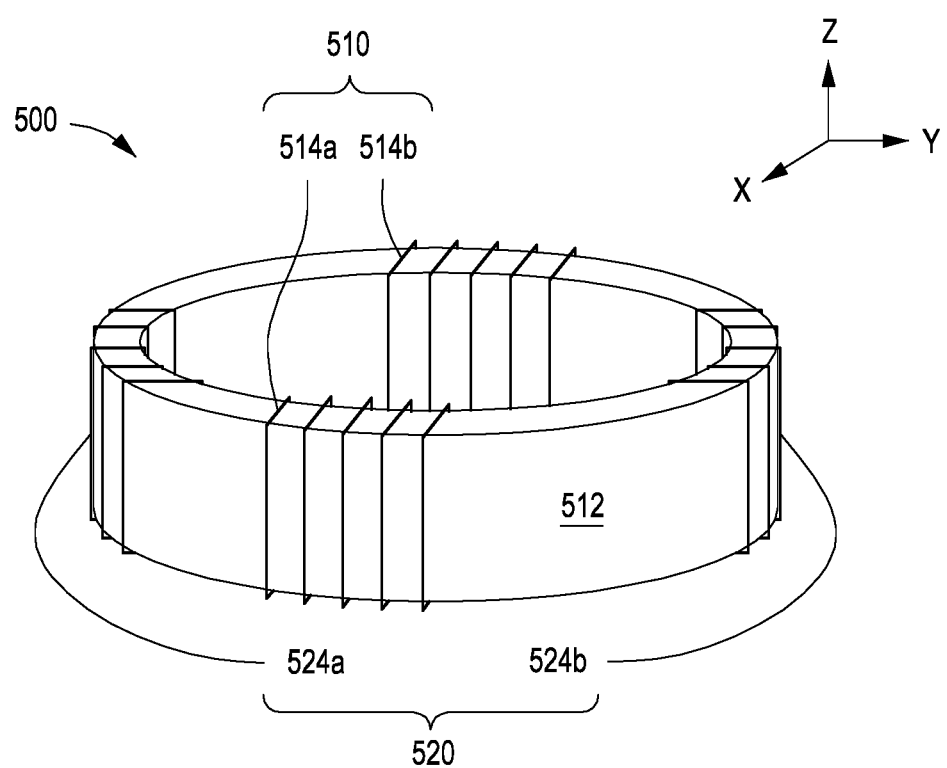
FIG. 5 depicts a schematic view of another compensating electromagnet that can be used in an NMR tool, according to one or more embodiments.

Each of the upper electromagnet 500a and the lower electromagnet 500b includes one or more magnetic cores 512 and one, two, or more windings 510, 520. The magnetic core 512 can be or contain a soft magnetic core. The windings 510, 520 is at least partially or completely wound, disposed, or positioned around the magnetic core 512. Each of the windings 510, 520 can be or include a single winding (as depicted in FIGS. 2A-2D), a two-section winding (as depicted in FIG. 3), two orthogonal, two section windings (as depicted in FIGS. 4A-4C and 5), or contain other winding configurations. For example, a compensating electromagnet 500 (as depicted in FIG. 5) and the compensating electromagnets 500a, 500b (as depicted in FIGS. 4A-4C) include two orthogonal windings 510, 520 at least partially or completely wound, disposed, or positioned around the magnetic core 512. The compensating electromagnets 500, 500a, 500b can be used in the NMR tool 400, as well as other NMR tools discussed and described herein.

The upper end magnet 450a is positioned to have a north pole of the upper end magnet 450a facing toward the upper electromagnet 500a and the upper axial end 432 of the soft magnetic core 430. The lower end magnet 450b is positioned to have a north pole of the lower end magnet 450b facing toward the lower electromagnet 500b and the lower axial end 434 of the soft magnetic core 430. The upper end magnet 450a is positioned to have a south pole of the upper end magnet 450a facing away from the upper electromagnet 500a and the upper axial end 432 of the soft magnetic core 430. The lower end magnet 450b is positioned to have a south pole of the lower end magnet 450b facing away from the lower electromagnet 500b and the lower axial end 434 of the soft magnetic core 430.

FIG. 4B depicts the NMR tool 400 having lateral movement with the antenna assembly 420 and the magnet assembly 448 activated and generating magnetic fields and the compensating assembly 488 inactivated and not generating a magnetic field. The NMR tool 400 is depicted as laterally moved from left to right in FIG. 4B, as indicated by the lateral displacement vector $\vec{s}(t)$ at 403.

The NMR tool 400 includes a compensating system 405 that contains, but is not limited to, one or more motion sensors, one or more sensor data processing units, a digital-to-analog converter (DAC), a power amplifier, a calibration system containing one or more magnetic field sensors, or any combination thereof. The one or more motion sensors (not shown) are disposed on and/or within the NMR tool 400. The motion sensor can be or include, but is not limited to, one or more accelerometers, one or more gyroscopes, one or more magnetometers, or any combination thereof. The motion sensor generates or otherwise produces readings for lateral motion of the antenna assembly 420, the magnet assembly 448, and/or the NMR tool 400. The sensor data processing unit (not shown) generates a time varying value proportional to the lateral motion of the antenna assembly 420, the magnet assembly 448, and/or the NMR tool 400. For example, the motion sensor and the sensor data processing unit are used to determine at least the lateral displacement vector $\vec{s}(t)$ 403 of the NMR tool 400 including the antenna assembly 420 and the magnet assembly 448.

One type of NMR experiment that can be typically implemented downhole to acquire NMR relaxation parameters is a CPMG experiment containing exciting nuclei with a sequence of radio-frequency pulses starting with an excitation pulse followed by a plurality of refocusing pulses. An NMR signal is generated in response to the radio-frequency pulse sequence in a form of plurality of spin echoes occurring between the refocusing pulses. Due to lateral motion during the CPMG experiment, the static magnetic field seen by excited nuclei on the right side (FIG. 4B) of the sensitive region increases from the static magnetic field shown at 422 to the static magnetic field shown at 424. The magnetic field at the opposite side of the sensitivity region decreases from the static magnetic field shown at 412 to the static magnetic field shown at 414. The compensating assembly 488 reduces variation of the static magnetic field in the region of interest due to the lateral motion during NMR measurements based on the readings for the lateral motion.

FIG. 4C depicts the NMR tool 400 having lateral movement with the antenna assembly 420 and the magnet assembly 448 activated and generating magnetic fields and the compensating assembly 498 also activated and generating magnetic fields. The compensating assembly 498 provides a lateral motion effect compensation using the compensating electromagnets 500a, 500b. For example, the upper and lower compensating electromagnets 500a, 500b generate or produce magnetic fields to compensate for the lateral motion of the antenna and magnet assemblies 420, 448. The compensating assembly 498 reduces the static magnetic field 422 that has an increased field due to lateral motion of the antenna and magnet assemblies 420, 448, such as when the NMR tool 400 is moved. Also, the compensating assembly 498 increases the static magnetic field 422 that has a decreased field due to lateral motion of the antenna and magnet assemblies 420, 448. The effective dipole moment, $\vec{p}_m(t)$, of the compensating electromagnets 500a, 500b is proportional to the lateral displacement, $\vec{s}(t)$, by the formula: $\vec{p}_m(t) \propto \vec{s}(t)$.

For example, the upper and lower compensating electromagnets 500a, 500b can be activated to produce magnetic fields 426a, 426b that reduce the total static magnetic field that was increased due to the lateral motion of the antenna and magnet assemblies 420, 448 and increase the static magnetic field (additional magnetic field 416a, 416b) that was reduced due to the lateral motion of the antenna and magnet assemblies 420, 448. As a result, the magnetic field seen by the nuclei spins remains unchanged or substantially unchanged, as if the NMR tool 400 did not experience lateral motion.

The current driving the upper and lower compensating electromagnets 500a, 500b is proportional to the motion sensor readings: $i(t)=\alpha \times \vec{s}(t)$, where the coefficient $\alpha$ can be determined during calibration of the magnetic field of the compensating assembly 498.

It should be noted that the presence of the magnetic core may modify the static magnetic field of the magnet assembly. A magnetized magnetic core creates some minor magnetic poles near the ends of the core. Thus the strength of the magnetic pole of the magnet may be slightly reduced by the magnetic core and make the total magnetic pole ("charge") slightly smaller. Due to the direction of the magnetic field relative to the core axis this effect is smaller for the sensor or the NMR tool 200 depicted in FIG. 2C compared to the sensor or the NMR tool 400 depicted in FIG. 4C. Calibration of the compensating system removes the effect of the magnetic pole reduction due to presence of the magnetic core.

FIG. 5 depicts a schematic view of an electromagnet 500 (e.g., the upper electromagnet 500a, the lower electromagnet 500b, or other electromagnets) that can be used in the NMR tool 400, as well as other NMR tools, according to one or more embodiments. The compensating electromagnet 500 includes windings 510, 520 at least partially or completely wound, disposed, or positioned around a magnetic core 512, such as a soft magnetic core. The windings 510, 520 can be two orthogonal windings such that the windings 510, 512 are orthogonally disposed from one another. In one or more embodiments, the winding 510 is a first two-section winding containing winding sections 514a, 514b and the winding 520 is a second two-section winding containing winding sections 524a, 524b, as depicted in FIG. 5.

The windings 510, 520 are used to compensate the magnetic field variation due to motion in any direction of the X-Y plane. The currents in the windings 510, 520 are determined by the following formulas:

$i_1(t) = \alpha_1 \times s_x(t)$ for winding 510, and $i_2(t) = \alpha_2 \times s_y(t)$ for winding 520, where $s_x(t)$ and $s_y(t)$ are the respective X and Y components of the lateral displacement; and $\alpha_1$ and $\alpha_2$ are coefficients that can be determined in calibration of the NMR tool.

Figure 6:
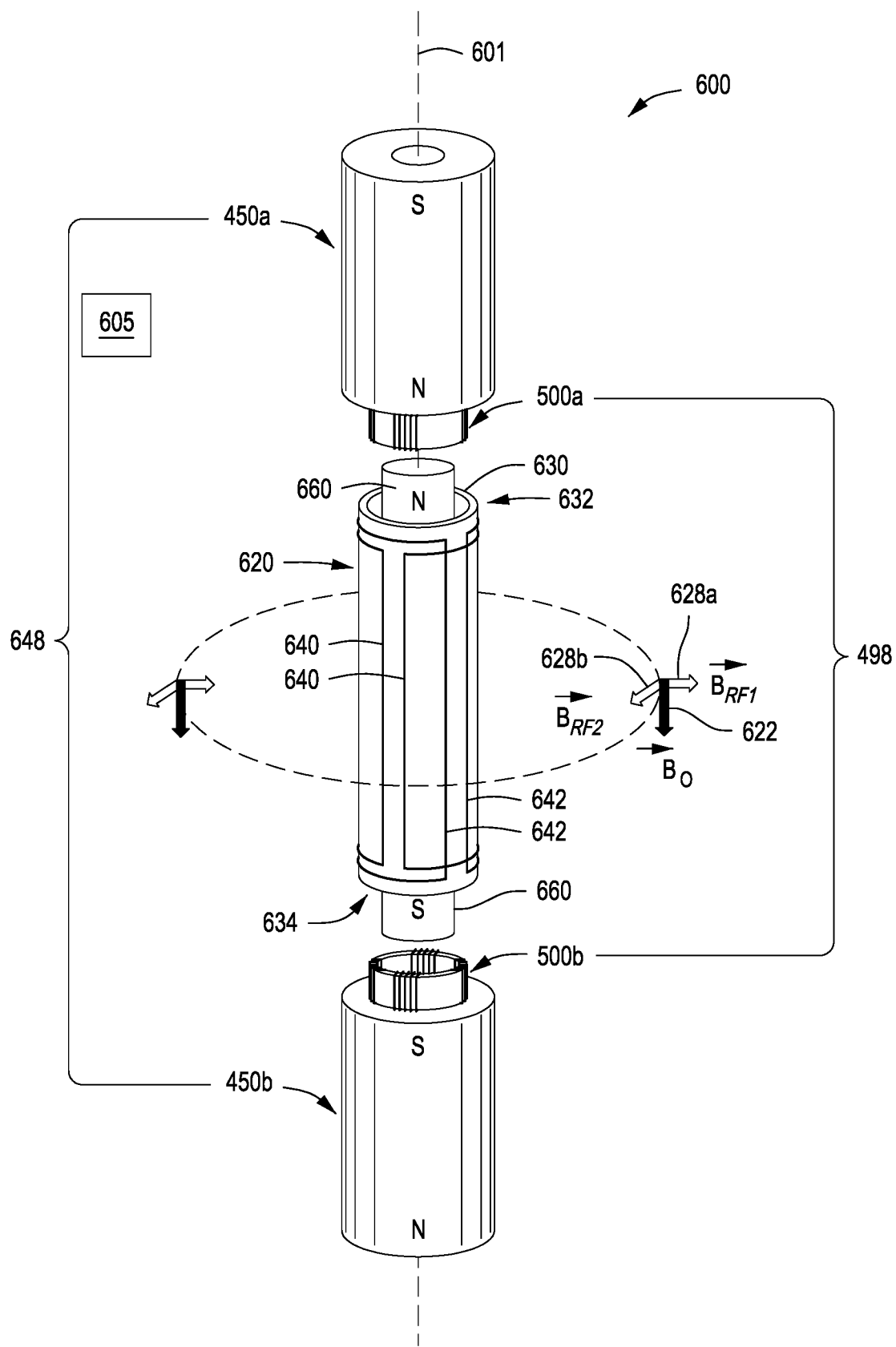
FIG. 6 depicts a schematic view of another NMR tool, according to one or more embodiments.

FIG. 6 depicts a schematic view of an NMR tool 600, according to one or more embodiments. In general, the NMR tool 600 includes a magnet assembly having three magnets, an antenna assembly enabling circular polarization of the radio-frequency magnetic field, and two-coil detection. More specifically, the NMR tool 600 can include, but is not limited to, one or more antenna assemblies 620, one or more magnet assemblies 648 containing a central magnet 660, and one or more compensating assemblies 498. The NMR tool 600 can be or include an LWD NMR sensor. In one or more embodiments, the NMR tool 600 is or includes the NMR logging tool 102, depicted in FIGS. 1A-1C, and can be used in the wellbore 104 with any or all components of the well systems 100a, 100b, and/or 100c, as discussed and described above. For example, a logging system located in or around any of the well systems 100a, 100b, or 100c, or another logging system, can include the NMR tool 600 operatively coupled to a drill string or wireline (not shown) and/or other components and used in the wellbore 104.

The NMR tool 600, as depicted in FIG. 6, has no lateral movement, the antenna assembly 620 and the magnet assembly 648 are activated and generating magnetic fields, and the compensating assembly 698 is inactivated and not generating a magnetic field. The antenna assembly 620 includes antenna windings 640, 642 at least partially disposed around a soft magnetic core 630. The soft magnetic core 630 can contain one, two, or more permanent magnets positioned therein (not shown). The soft magnetic core 630 includes an upper axial end 632 opposite a lower axial end 634. The upper and lower axial ends 632, 634 are axially aligned about a common axis 601 of the NMR tool 600.

As depicted in FIG. 6, the antenna windings 640, 642 can be or include two orthogonal windings, such that the antenna winding 640 and the antenna winding 642 are orthogonally disposed about each other. The antenna assembly 620 generates or produces two orthogonal RF magnetic fields 628a, 628b. The RF magnetic field 628a is generated or produced by the windings 640 and the RF magnetic field 628b is generated or produced by the windings 642. The two RF magnetic fields 628a, 628b have a phase shift of about 90° and therefore a circular polarized RF magnetic field is generated to excite NMR. The antenna assembly 620 generates the RF magnetic field more efficiently relative to a similar antenna assembly having only a single antenna winding. The windings 640, 642 are used to receive NMR signal. The NMR signals induced in the orthogonal windings 640, 642 are then processed in order to increase the signal-to-noise ratio (SNR) of the acquired NMR data.

The magnet assembly 648 includes the upper and lower end magnets 450a, 450b and the central magnet 660. The upper end magnet 450a is spaced apart from the upper axial end 632 of the soft magnetic core 630 and is axially aligned about the common axis 601. The lower end magnet 450b is spaced apart from the lower axial end 634 of the soft magnetic core 630 and is axially aligned about the common axis 601. The central magnet 660 is also axially aligned with the common axis 601.

The central magnet 660 is arranged so that like poles of the central magnet 660 are facing the poles of the respective neighboring end magnets 450a, 450b. The north pole of the end magnet 450a is facing toward the north pole of the central magnet 660 and the south pole of the end magnet 450b is facing toward the south pole of the central magnet 660, as depicted in FIG. 6. Alternatively, not shown, the south pole of the end magnet 450a can be facing toward the south pole of the central magnet 660 and the north pole of the end magnet 450b can be facing toward the north pole of the central magnet 660. The static magnetic field produced by the two end magnets 450a, 450b and the central magnet 660 is represented by arrows 622. The central magnet 660 can be used to shape and/or strengthen the static magnetic field 622 in the volume of investigation.

The compensating assembly 698 includes an upper electromagnet 500a and a lower electromagnet 500b. The central magnet 660 is located between the upper and lower compensating electromagnets 500a, 500b. In addition, the upper electromagnet 500a is located between the upper end magnet 450a and the upper axial end 632 of the soft magnetic core 630. The upper electromagnet 500a is axially aligned about the common axis 601. The lower electromagnet 500b is located between the lower end magnet 450b and the lower axial end 634 of the soft magnetic core 630. The lower electromagnet 500b is axially aligned about the common axis 601.

The upper end magnet 450a is positioned to have a north pole of the upper end magnet 450a facing toward the upper electromagnet 500a and the upper axial end 632 of the soft magnetic core 630. The lower end magnet 450b is positioned to have a north pole of the lower end magnet 450b facing toward the lower electromagnet 500b and the lower axial end 634 of the soft magnetic core 630. The upper end magnet 450a is positioned to have a south pole of the upper end magnet 450a facing away from the upper electromagnet 500a and the upper axial end 632 of the soft magnetic core 630. The lower end magnet 450b is positioned to have a south pole of the lower end magnet 450b facing away from the lower electromagnet 500b and the lower axial end 634 of the soft magnetic core 630.

The NMR tool 600 includes a compensating system 605 that contains, but is not limited to, one or more motion sensors, one or more sensor data processing units, a digital-to-analog converter (DAC), a power amplifier, a calibration system containing one or more magnetic field sensors, or any combination thereof. The one or more motion sensors (not shown) are disposed on and/or within the NMR tool

600. The motion sensor can be or include, but is not limited to, one or more accelerometers, one or more gyroscopes, one or more magnetometers, or any combination thereof. The motion sensor generates or otherwise produces readings for lateral motion of the antenna assembly 620, the magnet assembly 648, and/or the NMR tool 600. The sensor data processing unit (not shown) generates a time varying value proportional to the lateral motion of the antenna assembly 620, the magnet assembly 648, and/or the NMR tool 600. For example, the motion sensor and the sensor data processing unit are used to determine at least the lateral displacement vector $\vec{s}(t)$ of the NMR tool 600 including the antenna assembly 620 and the magnet assembly 648. The compensating assembly 698 reduces variation of the static magnetic field in the region of interest due to the lateral motion during NMR measurements based on the readings for the lateral motion.

A soft magnetic core, as discussed and described herein, including, but not limited to, the soft magnetic cores 230, 430, and 630, is made of a soft magnetic material that has a magnetic permeability of 5 or greater. Soft magnetic materials distinguish hard magnetic materials or permanent magnets used in the magnet assembly. Hard magnetic materials typically have a magnetic permeability of less than 5.

Figure 7:
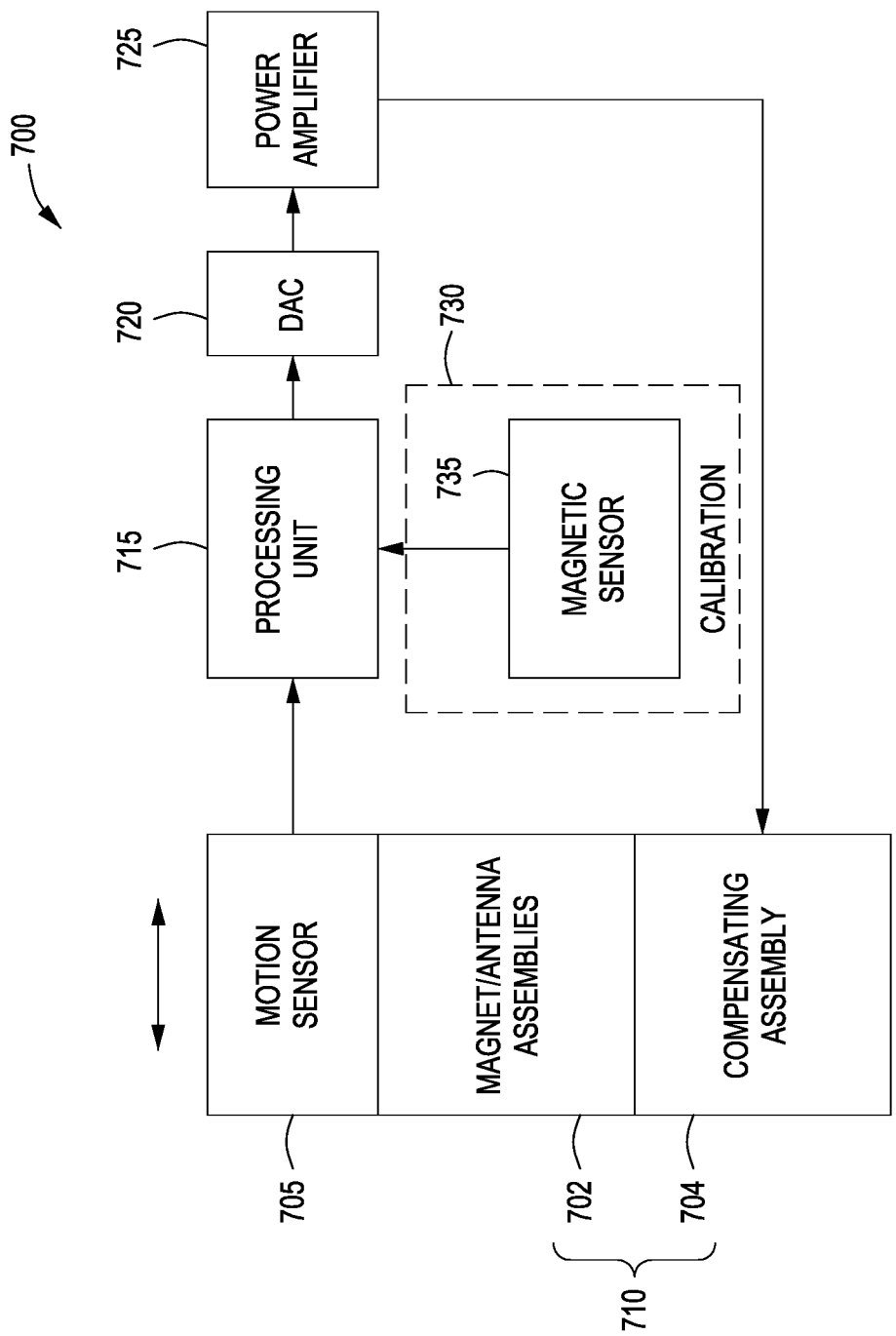
FIG. 7 depicts a schematic block diagram of a compensating system in a calibration mode, according to one or more embodiments.

FIG. 7 depicts a schematic block diagram of a compensating system 700 in a calibration mode, according to one or more embodiments. The compensating system 700 can be used with an NMR tool 710 containing magnet/antenna assemblies 702 and a compensating assembly 704. The compensating system 700 can be or include any of the compensating systems 205, 405, 605. Each of the NMR tools 200, 400, 600 can include the compensating system 700. The NMR tool 710 is or includes any of the NMR tools or components thereof discussed and described herein, as well as other NMR tools. The NMR tool 710 can be or include, but is not limited to, any one of the NMR tools 200, 400, 600, as well as other NMR tools. The magnet/antenna assembly 702 can be or include, but is not limited to, the antenna assembly 220 and the magnet assembly 248, the antenna assembly 420 and the magnet assembly 448, or the antenna assembly 620 and the magnet assembly 648. The compensating assembly 704 can be or include, but is not limited to, the compensating assembly 288 or 498.

The compensating system 700 also includes one or more motion sensors 705, one or more sensor data processing units 715, a digital-to-analog converter (DAC) 720, a power amplifier 725, a calibration system 730 containing one or more magnetic field sensors 735, or any combination thereof.

The one or more motion sensors 705 are disposed on and/or within the NMR tool 710. The motion sensor 705 can be or include, but is not limited to, one or more accelerometers, one or more gyroscopes, one or more magnetometers, or any combination thereof. The sensor data processing unit 715 generates a time varying value proportional to the lateral motion of the NMR tool 710 including the magnet/antenna assemblies 702 and the compensating assembly 704. For example, the motion sensor 705 and the sensor data processing unit 715 are used to determine at least the lateral displacement vector $\vec{s}(t)$ of the NMR tool 710 including the magnet/antenna assemblies 702 and the compensating assembly 704.

The DAC 720 and the power amplifier 725 are used to drive or otherwise power an upper winding in the upper electromagnet and a lower winding in the lower electromagnet within the compensating assembly 704. The sensor data processing unit 715 and the calibration system 730 containing the one or more magnetic field sensors 735 are used to calibrate the compensating assembly 704 in order to determine the coefficients $\alpha_1$ and $\alpha_2$, as discussed and described above.

By moving the NMR tool 710 including the magnet/antenna assemblies 702 and the compensating assembly 704 relative to the magnetic field sensor 735, variations of the readings of the magnetic field sensor 735 are observed and coefficient $\alpha$ (as described and discussed above) can be calculated based on the readings of the magnetic field sensor 735 and the processed motion sensor readings. After the coefficient $\alpha$ is determined and set accordingly (either digitally in the sensor data processing unit 715 and/or analogous by changing gain in the power amplifier), the magnetic field at the position of the magnetic field sensor 735 does not change in response to the lateral motion of the magnet/antenna assemblies 702. Once the system with the compensating electromagnets is calibrated, the magnetic field variation becomes substantially compensated in all the space surrounding the magnet assembly. In case the motion sensor is an accelerometer, the processing can be implemented as a double integration of the accelerometer readings.

A method for obtaining NMR data in a wellbore includes introducing the NMR tool 200, 400, or 600, and/or one or more other NMR tools, into a subterranean region of interest, such as the wellbore 104 with any or all components of the well systems 100a, 100b, and/or 100c, as discussed and described above. The NMR tool 200, 400, or 600 measures, determines, and/or processes well logging data within the subterranean region or other parts of the well. The NMR tool 200, 400, or 600, is moved along the axis of the wellbore 104 throughout the subterranean region when measuring well logging data. The NMR tool 200, 400, or 600, can be moved in any direction along the axis of the wellbore 104, including vertically, horizontally, or a combination thereof. A radio-frequency magnetic field is generated or otherwise produced by the antenna assembly and a static magnetic field is generated or otherwise produced by the magnet assembly when the antenna and magnet assemblies are within the subterranean region.

An increased field of the static magnetic field is generated or otherwise produced in the direction of lateral motion of the antenna and magnet assemblies and a decreased field of the static magnetic field is generated or otherwise produced in the direction opposite of the lateral motion. The effect of the lateral motion on the NMR data is reduced by applying, operating, or otherwise using the compensating assembly. At least a portion of the increased field of the static magnetic field is reduced and at least a portion of decreased field of the static magnetic field is increased by the compensating assembly.

In addition to the embodiments described above, embodiments of the present disclosure further relate to one or more of the following paragraphs:

1. A nuclear magnetic resonance (NMR) tool for measuring NMR properties of earth formations in a region of interest, comprising: an antenna assembly operable to generate a radio-frequency magnetic field; a magnet assembly operable to generate a static magnetic field; a motion sensor operable to generate readings for lateral motion of the antenna and magnet assemblies; a compensating assembly comprising at least one electromagnet; and wherein the compensating assembly is operable to reduce variation of the static magnetic field in the region of interest due to the lateral motion during NMR measurements based on the readings for the lateral motion.

2. An NMR tool for use in a wellbore, comprising: an antenna assembly comprising an antenna winding at least partially disposed around a soft magnetic core comprising an upper axial end opposite a lower axial end; a magnet assembly comprising an upper end magnet spaced apart from the upper axial end of the soft magnetic core and a lower end magnet spaced apart from the lower axial end of the soft magnetic core; a compensating assembly comprising an upper electromagnet disposed between the upper end magnet and the soft magnetic core and a lower electromagnet disposed between the lower end magnet and the soft magnetic core; wherein the antenna assembly and the magnet assembly produce a static magnetic field; and wherein the compensating assembly reduces the static magnetic field that has an increased field due to lateral motion of the antenna and magnet assemblies and increases the static magnetic field that has a decreased field due to lateral motion of the antenna and magnet assemblies.

3. A logging system, comprising: a conveyance; and an NMR tool for use in a wellbore and coupled to the conveyance, the NMR tool comprises: an antenna assembly comprising an antenna winding at least partially disposed around a soft magnetic core comprising an upper axial end opposite a lower axial end, the upper and lower axial ends are axially aligned by a common axis; a magnet assembly comprising an upper end magnet spaced apart from the upper axial end of the soft magnetic core and axially aligned with the common axis and a lower end magnet spaced apart from the lower axial end of the soft magnetic core and axially aligned with the common axis; and a compensating assembly comprising an upper electromagnet disposed between the upper end magnet and the upper axial end of the soft magnetic core and a lower electromagnet disposed between the lower end magnet and the lower axial end of the soft magnetic core, the upper and lower electromagnets are axially aligned with the common axis; wherein the antenna assembly and the magnet assembly produces a static magnetic field in a volume within a subterranean region; and wherein the compensating assembly reduces or increases the static magnetic field that has a changed field due to lateral motion of the antenna and magnet assemblies.

4. A method for obtaining NMR data in a wellbore by using the NMR tool or the logging system of any one of paragraphs 1-3.

5. A method for obtaining NMR data in a wellbore, comprising: introducing an NMR tool into the wellbore, wherein the NMR tool comprises: an antenna assembly operable to generate a radio-frequency magnetic field; a magnet assembly operable to generate a static magnetic field; and a compensating assembly comprising at least one electromagnet; producing a static magnetic field using the magnet assembly; measuring well logging data via the NMR tool; moving the NMR tool through the wellbore; and reducing the effect of lateral motion of the antenna and magnet assemblies on the NMR data by operating the compensating assembly.

6. The NMR tool, the logging system, and/or the method of any one of paragraphs 1-5, wherein the magnet assembly comprises an upper end magnet spaced apart from the upper axial end of a soft magnetic core and a lower end magnet spaced apart from the lower axial end of the soft magnetic core.

7. The NMR tool, the logging system, and/or the method of paragraph 6, wherein each of the upper electromagnet and the lower electromagnet comprises a winding, each of the windings comprises a two-section winding.

8. The NMR tool, the logging system, and/or the method of any one of paragraphs 1-7, wherein the motion sensor comprises an accelerometer, a gyroscope, a magnetometer, or any combination thereof.

9. The NMR tool, the logging system, and/or the method of paragraph 8, wherein each of the upper electromagnet and the lower electromagnet comprises a winding.

10. The NMR tool, the logging system, and/or the method of paragraph 9, wherein each of the windings comprises a two-section winding.

11. The NMR tool, the logging system, and/or the method of paragraph 9, wherein each of the windings is disposed around a magnetic core.

12. The NMR tool, the logging system, and/or the method of paragraph 8, wherein each of the upper electromagnet and the lower electromagnet comprises two windings disposed around a magnetic core.

13. The NMR tool, the logging system, and/or the method of paragraph 8, wherein each of the upper electromagnet and the lower electromagnet comprises a first two-section winding and a second two-section winding orthogonally disposed from one another.

14. The NMR tool, the logging system, and/or the method of paragraph 8, wherein the upper electromagnet and the lower electromagnet generate a magnetic field strength of up to about $2.5 \times 10^{-4}$ T.

15. The NMR tool, the logging system, and/or the method of paragraph 14, wherein the upper electromagnet and the lower electromagnet generate the magnetic field strength from a power in a range from about 5 W to about 15 W.

16. The NMR tool, the logging system, and/or the method of paragraph 8, wherein the upper end magnet is positioned to have a north pole of the upper end magnet facing toward the upper electromagnet and the upper axial end of the soft magnetic core, and wherein the lower end magnet is positioned to have a north pole of the lower end magnet facing toward the lower electromagnet and the lower axial end of the soft magnetic core.

17. The NMR tool, the logging system, and/or the method of paragraph 8, further comprising a motion sensor, a sensor data processing unit, a digital-to-analog converter, a power amplifier, a magnetic field sensor, or any combination thereof.

18. The NMR tool, the logging system, and/or the method of paragraph 17, wherein the NMR tool comprises the motion sensor, and wherein the motion sensor comprises an accelerometer, a gyroscope, a magnetometer, or any combination thereof.

19. The NMR tool, the logging system, and/or the method of paragraph 17, wherein the NMR tool comprises the sensor data processing unit, and wherein the sensor data processing unit generates a time varying value proportional to the lateral motion of the antenna and magnet assemblies.

20. The NMR tool, the logging system, and/or the method of paragraph 17, wherein the NMR tool comprises the digital-to-analog converter and the power amplifier, and wherein the digital-to-analog converter and the power amplifier power an upper winding in the upper electromagnet and a lower winding in the lower electromagnet.

21. The NMR tool, the logging system, and/or the method of paragraph 8, wherein the upper and lower axial ends of the soft magnetic core are axially aligned by a common axis.

22. The NMR tool, the logging system, and/or the method of paragraph 21, wherein each of the upper end magnet and the lower end magnet is independently axially aligned with the common axis.

23. The NMR tool, the logging system, and/or the method of any one of paragraphs 1-22, wherein the conveyance comprises a coiled tubing, a slickline, a wireline cable, a drill string, a drill pipe, a tubular, a tractor, or any combination thereof.

24. The NMR tool, the logging system, and/or the method of any one of paragraphs 1-23, wherein operating the compensating assembly comprises reducing at least a portion of an increased field of the static magnetic field and increasing at least a portion of a decreased field of the static magnetic field.

25. The NMR tool, the logging system, and/or the method of paragraph 24, wherein the increased field of the static magnetic field is in the direction of lateral motion of the antenna and magnet assemblies and the decreased field of the static magnetic field is in the direction opposite of the lateral motion.

26. The NMR tool, the logging system, and/or the method of any one of paragraphs 1-25, wherein the NMR tool further comprises a motion sensor operable to generate readings due to the lateral motion of the antenna and magnet assemblies.

27. The NMR tool, the logging system, and/or the method of paragraph 26, wherein the compensating assembly reduces variations of the static magnetic field in the region of interest due to the lateral motion of the antenna and magnet assemblies.

28. The NMR tool, the logging system, and/or the method of any one of paragraphs 1-27, wherein: the antenna assembly comprises an antenna winding at least partially disposed around a soft magnetic core having an upper axial end opposite a lower axial end; the magnet assembly comprises an upper end magnet spaced apart from the upper axial end of the soft magnetic core and a lower end magnet spaced apart from the lower axial end of the soft magnetic core; the at least one electromagnet comprises upper and lower electromagnets; and the compensating assembly comprises the upper electromagnet positioned between the upper end magnet and the upper axial end of the soft magnetic core and the lower electromagnet positioned between the lower end magnet and the lower axial end of the soft magnetic core.

29. The NMR tool, the logging system, and/or the method of paragraph 28, wherein each of the upper electromagnet and the lower electromagnet comprises a two-section winding positioned around a magnetic core.

27. The NMR tool, the logging system, and/or the method of paragraph 28, wherein each of the upper electromagnet and the lower electromagnet comprises a first two-section winding and a second two-section winding orthogonally disposed from one another and positioned around a magnetic core.

28. The NMR tool, the logging system, and/or the method of paragraph 28, wherein each of the upper electromagnet and the lower electromagnet generates a magnetic field strength of up to about $2.5 \times 10^{-4}$ T from a power in a range from about 5 W to about 15 W.

One or more specific embodiments of the present disclosure have been described. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

In the following discussion and in the claims, the articles "a," "an," and "the" are intended to mean that there are one or more of the elements. The terms "including," "comprising," and "having" and variations thereof are used in an open-ended fashion, and thus should be interpreted to mean "including, but not limited to . . . ." Also, any use of any form of the terms "connect," "engage," "couple," "attach," "mate," "mount," or any other term describing an interaction between elements is intended to mean either an indirect or a direct interaction between the elements described. In addition, as used herein, the terms "axial" and "axially" generally mean along or parallel to a central axis (e.g., central axis of a body or a port), while the terms "radial" and "radially" generally mean perpendicular to the central axis. The use of "top," "bottom," "above," "below," "upper," "lower," "up," "down," "vertical," "horizontal," and variations of these terms is made for convenience, but does not require any particular orientation of the components.

Certain terms are used throughout the description and claims to refer to particular features or components. As one skilled in the art will appreciate, different persons may refer to the same feature or component by different names. This document does not intend to distinguish between components or features that differ in name but not function.

Reference throughout this specification to "one embodiment," "an embodiment," "an embodiment," "embodiments," "some embodiments," "certain embodiments," or similar language means that a particular feature, structure, or characteristic described in connection with the embodiment may be included in at least one embodiment of the present disclosure. Thus, these phrases or similar language throughout this specification may, but do not necessarily, all refer to the same embodiment.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

The embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to suggest that the scope of the disclosure, including the claims, is limited to that embodiment.

What is claimed is:

1. A nuclear magnetic resonance (NMR) tool for measuring NMR properties of earth formations in a region of interest, comprising:
- an antenna assembly operable to generate a radio-frequency magnetic field;
- a magnet assembly operable to generate a static magnetic field;
- a motion sensor operable to generate readings for lateral motion of the antenna and magnet assemblies;
- a compensating assembly comprising at least one electromagnet; and
- wherein the compensating assembly is operable to reduce variation of the static magnetic field in the region of interest due to the lateral motion during NMR measurements based on the readings for the lateral motion.

2. The NMR tool of claim 1, wherein the magnet assembly comprises an upper end magnet spaced apart from the upper axial end of a soft magnetic core and a lower end magnet spaced apart from the lower axial end of the soft magnetic core.

3. The NMR tool of claim 2, wherein each of the upper electromagnet and the lower electromagnet comprises a winding, each of the windings comprises a two-section winding.

4. The NMR tool of claim 1, wherein the motion sensor comprises an accelerometer, a gyroscope, a magnetometer, or any combination thereof.

5. A nuclear magnetic resonance (NMR) tool for use in a wellbore, comprising:
- an antenna assembly comprising an antenna winding at least partially disposed around a soft magnetic core comprising an upper axial end opposite a lower axial end;
- a magnet assembly comprising an upper end magnet spaced apart from the upper axial end of the soft magnetic core and a lower end magnet spaced apart from the lower axial end of the soft magnetic core;
- a compensating assembly comprising an upper electromagnet disposed between the upper end magnet and the soft magnetic core and a lower electromagnet disposed between the lower end magnet and the soft magnetic core;
- wherein the antenna assembly and the magnet assembly produce a static magnetic field; and
- wherein the compensating assembly reduces the static magnetic field that has an increased field due to lateral motion of the antenna and magnet assemblies and increases the static magnetic field that has a decreased field due to lateral motion of the antenna and magnet assemblies.

6. The NMR tool of claim 5, wherein each of the upper electromagnet and the lower electromagnet comprises two windings disposed around a magnetic core.

7. The NMR tool of claim 5, wherein each of the upper electromagnet and the lower electromagnet comprises a first two-section winding and a second two-section winding orthogonally disposed from one another.

8. The NMR tool of claim 5, wherein the upper electromagnet and the lower electromagnet generate a magnetic field strength of up to about $2.5 \times 10^{-4}$ T.

9. The NMR tool of claim 8, wherein the upper electromagnet and the lower electromagnet generate the magnetic field strength from a power in a range from about 5 W to about 15 W.

10. The NMR tool of claim 5, wherein the upper end magnet is positioned to have a north pole of the upper end magnet facing toward the upper electromagnet and the upper axial end of the soft magnetic core, and wherein the lower end magnet is positioned to have a north pole of the lower end magnet facing toward the lower electromagnet and the lower axial end of the soft magnetic core.

11. The NMR tool of claim 5, further comprising a motion sensor, a sensor data processing unit, a digital-to-analog converter, a power amplifier, a magnetic field sensor, or any combination thereof.

12. The NMR tool of claim 11, wherein the NMR tool comprises the sensor data processing unit, and wherein the sensor data processing unit generates a time varying value proportional to the lateral motion of the antenna and magnet assemblies.

13. The NMR tool of claim 11, wherein the NMR tool comprises the digital-to-analog converter and the power amplifier, and wherein the digital-to-analog converter and the power amplifier power an upper winding in the upper electromagnet and a lower winding in the lower electromagnet.

14. The NMR tool of claim 5, wherein the upper and lower axial ends of the soft magnetic core are axially aligned by a common axis and each of the upper end magnet and the lower end magnet is independently axially aligned with the common axis.

15. A method for obtaining nuclear magnetic resonance (NMR) data in a wellbore, comprising:
- introducing an NMR tool into the wellbore, wherein the NMR tool comprises:
  - an antenna assembly operable to generate a radio-frequency magnetic field;
  - a magnet assembly operable to generate a static magnetic field; and
  - a compensating assembly comprising at least one electromagnet;
- producing a static magnetic field using the magnet assembly;
- measuring well logging data via the NMR tool;
- moving the NMR tool through the wellbore; and
- reducing the effect of lateral motion of the antenna and magnet assemblies on the NMR data by operating the compensating assembly to reduce at least a portion of an increased field of the static magnetic field and increase at least a portion of a decreased field of the static magnetic field.

16. The method of claim 15, wherein the increased field of the static magnetic field is in the direction of lateral motion of the antenna and magnet assemblies and the decreased field of the static magnetic field is in the direction opposite of the lateral motion.

17. The method of claim 15, wherein the NMR tool further comprises a motion sensor operable to generate readings due to the lateral motion of the antenna and magnet assemblies.

18. The method of claim 17, wherein the compensating assembly reduces variations of the static magnetic field in the region of interest due to the lateral motion of the antenna and magnet assemblies.

19. The method of claim 15, wherein:
- the antenna assembly comprises an antenna winding at least partially disposed around a soft magnetic core having an upper axial end opposite a lower axial end;
- the magnet assembly comprises an upper end magnet spaced apart from the upper axial end of the soft magnetic core and a lower end magnet spaced apart from the lower axial end of the soft magnetic core;

the at least one electromagnet comprises upper and lower electromagnets; and the compensating assembly comprises the upper electromagnet positioned between the upper end magnet and the upper axial end of the soft magnetic core and the lower electromagnet positioned between the lower end magnet and the lower axial end of the soft magnetic core.

20. The method of claim 19, wherein each of the upper electromagnet and the lower electromagnet comprises a two-section winding positioned around a magnetic core.

21. The method of claim 19, wherein each of the upper electromagnet and the lower electromagnet comprises a first two-section winding and a second two-section winding orthogonally disposed from one another and positioned around a magnetic core.

22. The method of claim 19, wherein each of the upper electromagnet and the lower electromagnet generates a magnetic field strength of up to about $2.5 \times 10^{-4}$ T from a power in a range from about 5 W to about 15 W.

23. A logging system, comprising:

a conveyance;

a nuclear magnetic resonance (NMR) tool for use in a wellbore and coupled to the conveyance, the NMR tool comprises:

an antenna assembly comprising an antenna winding at least partially disposed around a soft magnetic core comprising an upper axial end opposite a lower axial end, the upper and lower axial ends are axially aligned by a common axis;

a magnet assembly comprising an upper end magnet spaced apart from the upper axial end of the soft magnetic core and axially aligned with the common axis and a lower end magnet spaced apart from the lower axial end of the soft magnetic core and axially aligned with the common axis; and a compensating assembly comprising an upper electromagnet disposed between the upper end magnet and the upper axial end of the soft magnetic core and a lower electromagnet disposed between the lower end magnet and the lower axial end of the soft magnetic core, the upper and lower electromagnets are axially aligned with the common axis;

wherein the antenna assembly and the magnet assembly produces a static magnetic field in a volume within a subterranean region; and wherein the compensating assembly reduces or increases the static magnetic field that has a changed field due to lateral motion of the antenna and magnet assemblies.

24. The logging system of claim 23, wherein the conveyance comprises a coiled tubing, a slickline, a wireline cable, a drill string, a drill pipe, a tubular, a tractor, or any combination thereof.

* * * * *